(12) United States Patent
Madurawe

(10) Patent No.: US 8,810,276 B2
(45) Date of Patent: *Aug. 19, 2014

(54) PROGRAMMABLE STRUCTURED ARRAYS

(76) Inventor: Raminda U. Madurawe, Sunnyvale, CA (US)

( * ) Notice: Subject to any disclaimer, the term of this patent is extended or adjusted under 35 U.S.C. 154(b) by 36 days.

This patent is subject to a terminal disclaimer.

(21) Appl. No.: 13/598,342

(22) Filed: Aug. 29, 2012

(65) Prior Publication Data

US 2012/0319728 A1    Dec. 20, 2012

Related U.S. Application Data

(63) Continuation of application No. 12/018,243, filed on Jan. 23, 2008, now Pat. No. 8,274,309, which is a continuation of application No. 11/403,118, filed on Apr. 13, 2006, now Pat. No. 7,323,905, which is a continuation of application No. 10/727,170, filed on Dec. 4, 2003, now Pat. No. 7,030,651.

(51) Int. Cl.
*H03K 19/173*    (2006.01)

(52) U.S. Cl.
USPC .............................................. 326/38; 326/101

(58) Field of Classification Search
USPC ..................................................... 326/37–41
See application file for complete search history.

(56) References Cited

U.S. PATENT DOCUMENTS

| | | |
|---|---|---|
| 4,609,986 A | 9/1986 | Hartmann et al. |
| 4,706,216 A | 11/1987 | Carter |
| 4,761,768 A | 8/1988 | Turner et al. |
| 4,864,161 A | 9/1989 | Norman et al. |
| 4,870,302 A | 9/1989 | Freeman |
| 4,873,459 A | 10/1989 | El Gamal et al. |
| 5,164,612 A | 11/1992 | Kaplinsky |
| 5,191,241 A | 3/1993 | McCollum et al. |
| 5,216,636 A | 6/1993 | Runaldue |
| 5,343,406 A | 8/1994 | Freeman et al. |
| 5,347,519 A | 9/1994 | Cooke et al. |
| 5,488,316 A | 1/1996 | Freeman et al. |
| 5,563,526 A | 10/1996 | Hastings et al. |
| 5,581,501 A | 12/1996 | Sansbury et al. |
| 5,612,631 A | 3/1997 | Agrawal et al. |
| 5,625,221 A | 4/1997 | Kim et al. |
| 5,679,967 A | 10/1997 | Janai et al. |
| 5,684,744 A | 11/1997 | Orgill et al. |
| 5,701,233 A | 12/1997 | Carson et al. |
| 5,781,031 A | 7/1998 | Bertin et al. |
| 5,793,115 A | 8/1998 | Zavracky et al. |
| 5,835,405 A | 11/1998 | Tsui et al. |
| 5,844,422 A | 12/1998 | Trimberger et al. |
| 5,880,598 A | 3/1999 | Duong |
| 5,943,574 A | 8/1999 | Tehrani et al. |
| 5,949,710 A | 9/1999 | Pass et al. |
| 5,949,719 A | 9/1999 | Clinton et al. |
| 6,005,806 A | 12/1999 | Madurawe et al. |
| 6,018,476 A | 1/2000 | Madurawe et al. |
| 6,097,211 A | 8/2000 | Couts-Martin et al. |
| 6,134,171 A | 10/2000 | Yamagata et al. |

(Continued)

OTHER PUBLICATIONS

Ashok K. Sharma, "Programmable Logic Handbook-PLDs, CPLDs, & FPGAs", 1998, pp. 99-171, McGraw-Hill, USA.

(Continued)

*Primary Examiner* — Don Le

(57) ABSTRACT

A programmable semiconductor device includes a user programmable switch comprising a configurable element positioned above a transistor material layer deposited on a substrate layer.

20 Claims, 10 Drawing Sheets

(56) References Cited

U.S. PATENT DOCUMENTS

| | | |
|---|---|---|
| 6,134,173 A | 10/2000 | Cliff et al. |
| 6,191,614 B1 | 2/2001 | Schultz et al. |
| 6,242,767 B1 | 6/2001 | How et al. |
| 6,259,271 B1 | 7/2001 | Couts-Martin et al. |
| 6,262,596 B1 | 7/2001 | Schultz et al. |
| 6,275,064 B1 | 8/2001 | Agrawal et al. |
| 6,275,065 B1 | 8/2001 | Mendel |
| 6,331,784 B1 | 12/2001 | Mason et al. |
| 6,331,789 B2 | 12/2001 | Or-Bach |
| 6,337,579 B1 | 1/2002 | Mochida |
| 6,340,830 B1 | 1/2002 | Takemura |
| 6,353,562 B2 | 3/2002 | Bohm et al. |
| 6,420,925 B1 | 7/2002 | Fifield et al. |
| 6,426,649 B1 | 7/2002 | Fu et al. |
| 6,448,808 B2 | 9/2002 | Young et al. |
| 6,480,027 B1 | 11/2002 | Ngai et al. |
| 6,496,887 B1 | 12/2002 | Plants |
| 6,504,742 B1 | 1/2003 | Tran et al. |
| 6,515,511 B2 | 2/2003 | Sugibayashi et al. |
| 6,525,953 B1 | 2/2003 | Johnson |
| 6,526,559 B2 | 2/2003 | Schiefele et al. |
| 6,551,857 B2 | 4/2003 | Leedy |
| 6,582,980 B2 | 6/2003 | Feldman et al. |
| 6,613,611 B1 | 9/2003 | How et al. |
| 6,614,259 B2 | 9/2003 | Couts-Martin et al. |
| 6,627,985 B2 | 9/2003 | Huppenthal et al. |
| 6,737,675 B2 | 5/2004 | Patel et al. |
| 6,738,962 B1 | 5/2004 | Flaherty et al. |
| 6,798,240 B1 | 9/2004 | Pedersen |
| 6,812,731 B1 | 11/2004 | Trimberger |
| 6,911,730 B1 | 6/2005 | New |
| 6,917,219 B2 | 7/2005 | New |
| 6,946,330 B2 | 9/2005 | Yamazaki et al. |
| 6,954,084 B2 | 10/2005 | Islam |
| 6,992,503 B2 | 1/2006 | Madurawe |
| 6,998,722 B2 | 2/2006 | Madurawe |
| 7,019,557 B2 | 3/2006 | Madurawe |
| 7,030,651 B2 | 4/2006 | Madurawe |
| 7,064,018 B2 | 6/2006 | Madurawe |
| 7,064,579 B2 | 6/2006 | Madurawe |
| 7,084,666 B2 | 8/2006 | Madurawe |
| 7,112,994 B2 | 9/2006 | Madurawe |
| 7,176,713 B2 | 2/2007 | Madurawe |
| 7,253,659 B2 | 8/2007 | Madurawe |
| 7,268,580 B2 | 9/2007 | Madurawe |
| 2001/0003428 A1 | 6/2001 | Or-Bach |
| 2001/0019155 A1 | 9/2001 | Warashina et al. |
| 2001/0028059 A1 | 10/2001 | Emma et al. |
| 2001/0047509 A1 | 11/2001 | Mason et al. |
| 2002/0177260 A1 | 11/2002 | Matsumoto |
| 2002/0186044 A1 | 12/2002 | Agrawal et al. |
| 2003/0001615 A1 | 1/2003 | Sueyoshi et al. |
| 2003/0023762 A1 | 1/2003 | Dhir et al. |
| 2003/0085733 A1 | 5/2003 | Pugh et al. |
| 2003/0227056 A1 | 12/2003 | Wang et al. |
| 2004/0178819 A1 | 9/2004 | New |
| 2005/0023656 A1 | 2/2005 | Leedy |
| 2006/0195729 A1 | 8/2006 | Huppenthal et al. |

OTHER PUBLICATIONS

Alexander, et al., "Three-Dimensional Field—Programmable Gate Arrays", Proceedings of the 8th Annual IEEE International ASIC Conference and Exhibit, 1995, pp. 253-256.

Chen Dong et al., "3-D n FPGA: A reconfigureable architecture for 3-D CMOS/Nanomaterial Hybrid Digigital Circuits", IEEE Trans. Circuits and Systems, vol. 54, No. 11 Nov. 1, 2007 (pp. 2489-2501).

Seaks & Whapshot, "Programmable Logic-PLDs and FPGAs" 1997,99, 102-117, McGraw-Hill, USA.

V.Betz, J. Rose, A. Marquardt, "Architecture and AD for Deep Submicron FPGAs", Feb. 1999, Kluwer Academic Publishers, Boston.

Non Final Office Action Dated May 25, 2006; U.S. Appl. No. 11/355,930.

Notice of Allowance Dated Jul. 21, 2006; U.S. Appl. No. 11/355,930.

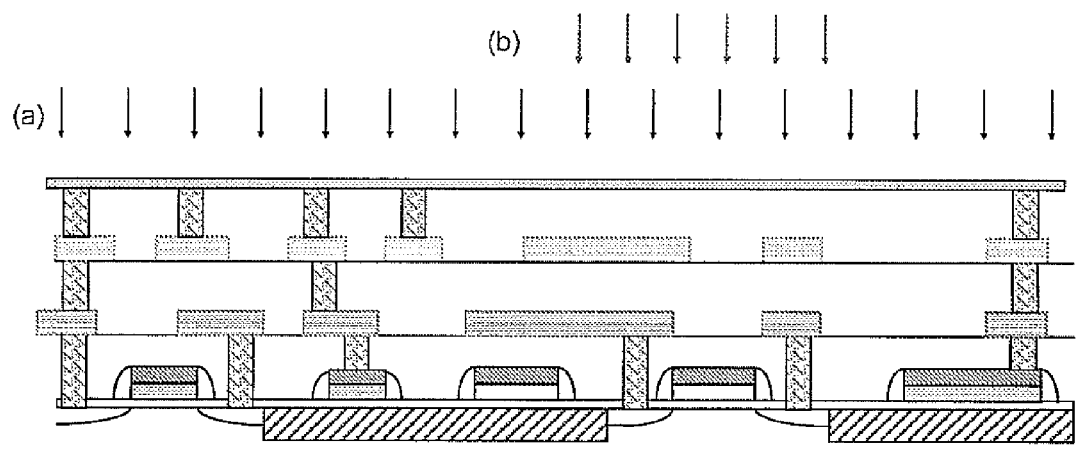
Fig-7.1
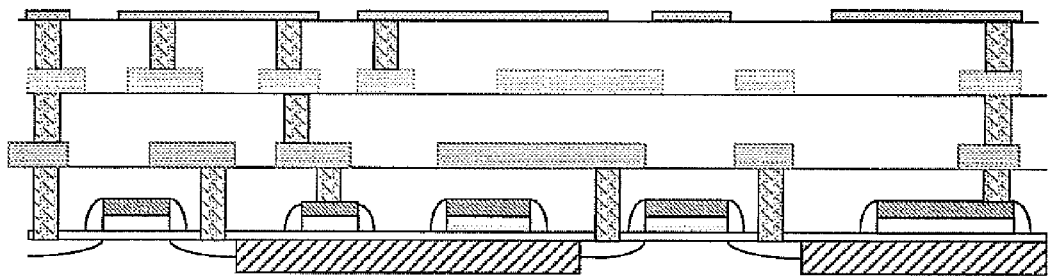
Fig-7.2

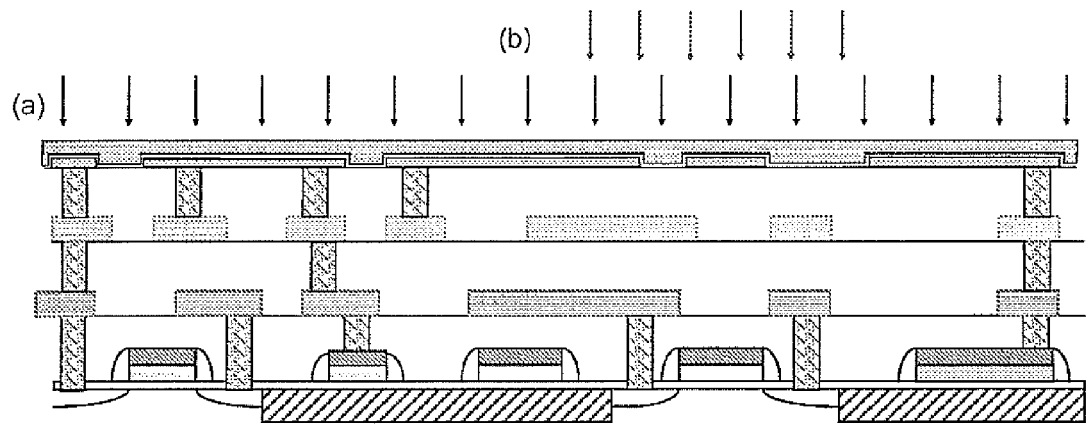
Fig-7.3
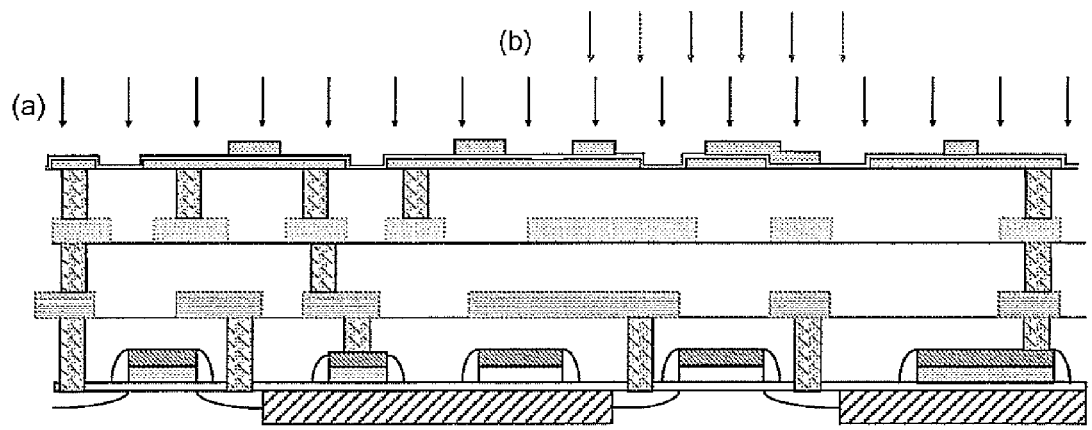
Fig-7.4

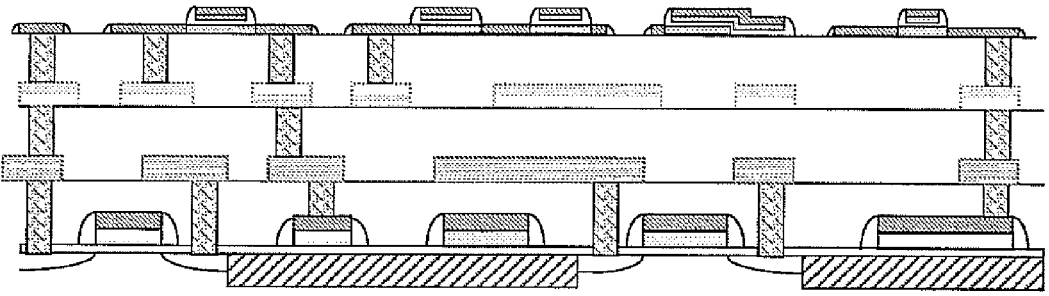
Fig-7.5
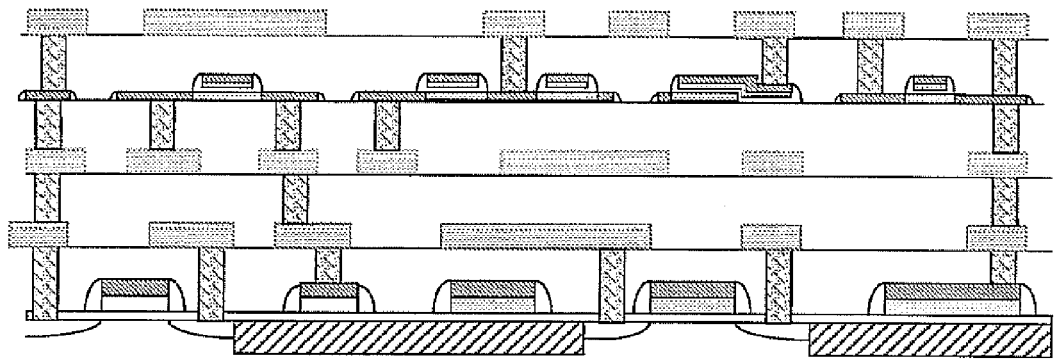
Fig-7.6
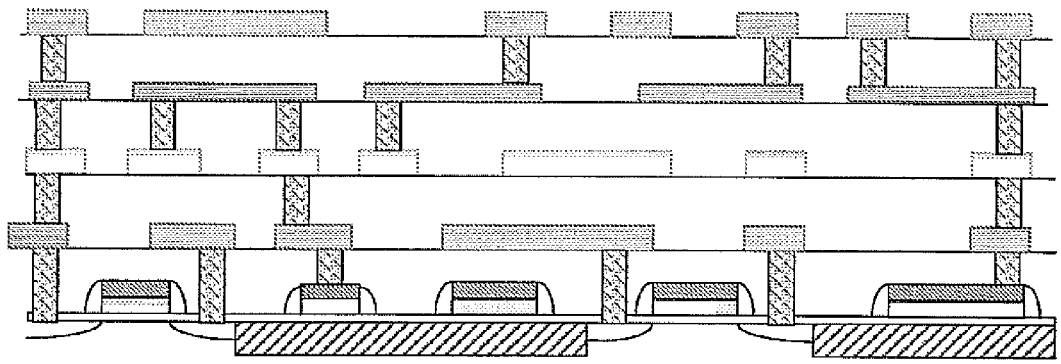
Fig-7.7

PROGRAMMABLE STRUCTURED ARRAYS

This application is a continuation of application Ser. No. 12/018,243 (now U.S. Pat. No. 8,274,309) filed Jan. 23, 2008, which is a continuation of application Ser. No. 11/403,118 (now U.S. Pat. No. 7,323,905) filed Apr. 13, 2006, which is a continuation of application Ser. No. 10/727,170 (now U.S. Pat. No. 7,030,651) filed on Dec. 4, 2003, and list as inventor Mr. R. U. Madurawe, the contents of each are incorporated herein by reference. This application is related to application Ser. Nos. 10/267,483, 10/267,484 (now abandoned) and Ser. No. 10/267,511 (now U.S. Pat. No. 6,747,478) all of which were filed on Oct. 8, 2002 and list as inventor Mr. R. U. Madurawe, the contents of which are incorporated herein by reference.

This application is also related to application Ser. No. 10/413,809 (now U.S. Pat. No. 6,855,988), Ser. No. 10/413,808 (now abandoned) and Ser. No. 10/413,810 (now U.S. Pat. No. 6,828,689), all of which were filed Apr. 14, 2003 and list as inventor Mr. R. U. Madurawe, the contents of which are incorporated herein by reference.

This application is further related to application Ser. No. 11/102,855 (now U.S. Pat. No. 7,312,109) filed Apr. 1, 2005 and Ser. No. 11/355,930 (now U.S. Pat. No. 7,253,659) filed Feb. 17, 2006, both of which list as inventor Mr. R. U. Madurawe, the contents of which are incorporated herein by reference.

BACKGROUND

The present invention relates to programmable structured arrays for semiconductor integrated circuits.

Traditionally, application specific integrated circuit (ASIC) devices have been used in the integrated circuit (IC) industry to reduce cost, enhance performance or meet space constraints. The generic class of ASIC devices falls under a variety of sub classes such as Custom ASIC, Standard cell ASIC, Gate Array and Field Programmable Gate Array (FPGA) where the degree of user allowed customization varies. In this disclosure the word ASIC is used only in reference to Custom and Standard Cell ASICs, and reference to remaining ICs such as FPGA and Gate Arrays will be by their sub-classification. The devices FPGA include Programmable Logic Devices (PLD) and Complex Programmable Logic Devices (CPLD), while the devices Gate Array include Laser Programmable Gate Arrays (LPGA), Mask Programmable Gate Arrays (MPGA) and a new class of devices known as Structured ASIC or Structured Arrays.

The design and fabrication of ASICs can be time consuming and expensive. The customization involves a lengthy design cycle during the product definition phase and high Non Recurring Engineering (NRE) costs during manufacturing phase. In the event of finding a logic error in the custom or semi-custom ASIC during final test phase, the design and fabrication cycle has to be repeated. Such lengthy correction cycles further aggravate the time to market and engineering cost. As a result, ASICs serve only specific applications and are custom built for high volume and low cost. The high cost of masks and unpredictable device life time shipment volumes have caused ASIC design starts to fall precipitously in the IC industry. ASICs offer no device for off the shelf verification, no user customization capability and requires a full custom mask set for fabrication.

Gate Array customizes pre-defined modular blocks at a reduced NRE cost by synthesizing the module connections with a software model similar to the ASIC. The Gate Array has an array of non programmable functional modules fabricated on a semiconductor substrate. To interconnect these modules to a user specification, multiple layers of wires are used during a synthesis process. The level of customization may be limited to a single metal layer, or single via layer, or multiple metal layers, or multiple metals and via layers. The goal is to reduce the customization cost to the user, and provide the customized product faster. As a result, the customizable layers are designed to be the top most metal and via layers of a semiconductor fabrication process. This is an inconvenient location to customize wires. The customized transistors are located at the substrate level of the Silicon. All possible connections have to come up to the top level metal. The complexity of bringing up connections is a severe constraint for these devices. Structured ASICs fall into larger module Gate Arrays. These devices discussed in Or-Bach U.S. Pat. No. 6,331,789, How et al. U.S. Pat. No. 6,242,767, U.S. Pat. No. 6,613,611 have varying degrees of complexity in the structured cell and varying degrees of complexity in the custom interconnection. The absence of silicon for design verification and design optimization results in multiple spins and lengthy design iterations to the end user. The Gate Array evaluation phase is no different to that of an ASIC. The advantage over ASIC is in a lower upfront NRE cost for the fewer customization layers, tools and labor. Gate Arrays offer no device for off the shelf verification, metallization based user customization during synthesis and requires a partial custom mask set for fabrication.

In recent years there has been a move away from custom, semi-custom and Gate Array ICs toward field programmable components whose function is determined not when the integrated circuit is fabricated, but by an end user "in the field" prior to use. Off the shelf FPGA products greatly simplify the design cycle and are fully customized by the user. These products offer user-friendly software to fit custom logic into the device through programmability, and the capability to tweak and optimize designs to improve silicon performance. Provision of this programmability is expensive in terms of silicon real estate, but reduces design cycle time, time to solution (TTS) and upfront NRE cost to the designer. FPGAs offer the advantages of low NRE costs, fast turnaround (designs can be placed and routed on an FPGA in typically a few minutes), and low risk since designs can be easily amended late in the product design cycle. It is only for high volume production runs that there is a cost benefit in using the other two approaches. Compared to FPGA, an ASIC and Gate Array both have hard-wired logic connections, identified during the chip design phase. ASIC has no multiple logic choices and both ASIC and Gate Arrays have no configuration memory to customize logic. This is a large chip area and a product cost saving for these approach to design. Smaller die sizes also lead to better performance. A full custom ASIC has customized logic functions which take less gate counts compared to Gate Arrays, PLD and FPGA configurations of the same functions. Thus, an ASIC is significantly smaller, faster, cheaper and more reliable than an equivalent gate-count PLD or FPGA. A Gate Array is also smaller, faster and cheaper compared to an equivalent FPGA. The trade-off is between time-to-market (PLD and FPGA advantage) versus low cost and better reliability (ASIC advantage). A Gate Array falls in the middle with an improvement in the ASIC NRE cost at a moderate penalty to product cost and performance. The cost of Silicon real estate for programmability provided by the PLD and FPGA compared to ASIC and Gate Array contribute to a significant portion of the extra cost the user has to bear for customer re-configurability in logic functions.

In a PLD and an FPGA, a complex logic design is broken down to smaller logic blocks and programmed into logic blocks provided in the FPGA. Logic blocks contain multiple smaller logic elements. Logic elements facilitates sequential and combinational logic design implementations. Combinational logic has no memory and outputs reflect a function solely of present inputs. Sequential logic is implemented by inserting memory into the logic path to store past history. Current PLD and FPGA architectures include transistor pairs, NAND or OR gates, multiplexers, look-up-tables (LUTs) and AND-OR structures in a basic logic element. In a PLD the basic logic element is labeled a macro-cell. Hereafter the terminology FPGA will include both FPGAs and PLDs, and the terminology logic element will include both logic elements and macro-cells. Granularity of an FPGA refers to logic content of the basic logic element. Smaller blocks of a complex logic design are customized to fit into FPGA grain. In fine-grain architectures, a small basic logic element is enclosed in a routing matrix and replicated. These offer easy logic fitting at the expense of complex routing. In course-grain architectures, many basic logic elements are combined with local routing and wrapped in a routing matrix to form a large logic block. The larger logic block is then replicated with global routing. Larger logic blocks make the logic fitting difficult and the routing easier. A challenge for FPGA architectures is to provide easy logic fitting (like fine-grain) and maintain easy routing (like course-grain).

A logic element used in Gate Arrays is called a structured cell or a module. These cells can also include transistor pairs, NAND or OR gates, MUXs and LUTs. To include sequential logic designs, the structured cell may also include flip-flops. An exemplary logic element, or a structured cell, or a module, described in Ref-1 (Seals & Whapshott) is shown in FIG. 1A. The logic element has a built in D-flip-flop 105 for sequential logic implementation. In addition, elements 101, 102 and 103 are 2:1 MUX's controlled by one input signal for each MUX. Input S1 feeds into 101 and 102, while inputs S1 and S2 feeds into OR gate 104, and the output from OR gate feeds into 103. Element 105 is the D-Flip-Flop receiving Preset, Clear and Clock signals. Ignoring the global Preset & Clear signals, eight inputs feed the logic block, and one output leaves the logic block. All two-input, most 2-input and some 3-input variable functions are realized in the logic block and latched to the D-Flip-Flop. Inputs and outputs for the Logic Element or Logic Block are selected from the programmable Routing Matrix. An exemplary routing matrix containing logic elements as described in Ref-1 is shown in FIG. 1B. Each logic element 112 is as shown in FIG. 1A. The 8 inputs and 1 output from logic element 112 in FIG. 1B are routed to 22 horizontal and 12 vertical interconnect wires that have programmable via connections 110. These connections 110 may be anti-fuses or pass-gate transistors controlled by SRAM memory elements. The user selects how the wires are connected during the design phase, and programs the connections in the field. FPGA architectures for various commercially available devices are discussed in Ref-1 (Seals & Whapshott) as well as Ref-2 (Sharma). A comprehensive thesis on FPGA routing architecture is provided in Ref-3 (Betz, Rose & Marquardt).

A Gate Array routing matrix is shown in FIG. 1C with the same logic element 122 as shown in FIG. 1A. The 8 inputs and 1 output of logic element 122 in FIG. 1C are hard wired into an array of logic and a multiplicity of potential connections are brought up to a lower metal layer, below the customizable metal layer. Two orthogonal metal layers are shown in FIG. 1C with either one being the top metal (say dotted lines) and the other metal below the top metal (say solid lines). The top metal mask has to be customized to complete all the logic connections as specified by the design to connect the plurality of logic elements 122. This is achieved by laying top metal in the pre-defined tracks and connecting them to lower metal at via connections 121 accordingly. Pads are similarly connected to top metal as assigned in the design. Circle 121 represents a pre-defined top metal connection to a lower metal. To account for inefficiency in track utilization, excess wires at a higher chip area compared to an ASIC must be provided. The X-Y connection matrix may be completed by a single custom mask of the top metal in theory, but a multi-metal customization is more practical to achieve. Solid lines and via connections in FIG. 1C pre-exist and do not change during the one mask customization. Inputs and outputs of logic elements 122 are connected to synthesized dotted metal lines and customized in top metal to complete interconnection. Clock skews and inefficient utilization of metal tracks complicates the design and increases the NRE cost. Access to all metal layers for the customization makes synthesis and fixing clock skews easier at the expense of higher mask costs and longer fabrication delay. Some commercial Gate Array solutions offer four metal layers to customize the interconnect as it is difficult to get all the possible logic element connections into top metal layer.

FPGA architectures are discussed in Hartmann U.S. Pat. No. 4,609,986, Carter U.S. Pat. No. 4,706,216, Turner et al. U.S. Pat. No. 4,761,768, Freemann U.S. Pat. No. 4,870,302, ElGamal et al. U.S. Pat. No. 4,873,459, Freemann et al. U.S. Pat. Nos. 5,488,316 & 5343406, Tsui et al. U.S. Pat. No. 5,835,405, Trimberger et al. U.S. Pat. No. 5,844,422, Cliff et al. U.S. Pat. No. 6,134,173, Mendel U.S. Pat. No. 6,275,065, Young et al. U.S. Pat. No. 6,448,808, and Sugibayashi et al. U.S. Pat. No. 6,515,511. These patents disclose specialized routing blocks to connect logic elements in FPGA's and macro-cells in PLD's. In all cases the routing block is programmed to define inputs and outputs for the logic blocks, while the logic block is programmed to perform a specific logic function.

Four exemplary methods of programmable point to point connections synonymous with programmable switches, between node A and node B are shown in FIG. 2. These form connections 110 in FIG. 1B where node A is located in a first wire and node B is located in a second wire. A configuration circuit to program the connection is not shown in FIG. 2. All the patents listed under FPGA architecture use one or more of these basic programmable connections. In FIG. 2A, a conductive fuse link 210 connects A to B. It is normally connected, and passage of a high current or exposure to a laser beam will blow the conductor open. In FIG. 2B, a capacitive anti-fuse element 220 disconnects A to B. It is normally open, and passage of a high current will pop the insulator shorting the two terminals. Fuse and anti-fuse are both one time programmable due to the non-reversible nature of the change. In FIG. 2C, a pass-gate device 230 connects A to B. The gate signal $S_0$ determines the nature of the connection, on or off. This is a non destructive change. The gate signal is generated by manipulating logic signals, or by configuration circuits that include memory. The choice of memory varies from user to user. In FIG. 2D, a floating-pass-gate device 240 connects A to B. Control gate signal $S_0$ couples a portion of that to floating gate. Electrons trapped in the floating gate determines an on or off state for the connection. Hot-electrons and Fowler-Nordheim tunneling are two mechanisms for injecting charge to floating-gates. When high quality insulators encapsulate the floating gate, trapped charge stays for over 10 years. These provide non-volatile memory. EPROM, EEPROM and Flash memory employ floating-gates and are non-volatile. Anti-fuse and SRAM based architectures are widely used in commercial FPGA's, while EPROM, EEPROM, anti-fuse and fuse links are widely used in commercial PLD's. Volatile SRAM memory needs no high programming voltages, is freely available in every logic process, is compatible with standard CMOS SRAM memory, lends to process and voltage scaling and has become the de-facto choice for modern day very large FPGA device constriction.

A volatile six transistor SRAM based configuration circuit is shown in FIG. 3A. The SRAM memory element can be any one of 6-transistor, 5-transistor, full CMOS, R-load or TFT PMOS load based cells to name a few. Two inverters 303 and 304 connected back to back forms the memory element. This memory element is a latch. The latch can be constructed as full CMOS, R-load, PMOS load or any other. Power and ground terminals for the inverters are not shown in FIG. 3A. Access NMOS transistors 301 and 302, and access wires GA, GB, BL and BS provide the means to configure the memory element. Applying zero and one on BL and BS respectively, and raising GA and GB high enables writing zero into device 301 and one into device 302. The output $S_0$ delivers a logic one. Applying one and zero on BL and BS respectively, and raising GA and GB high enables writing one into device 301 and zero into device 302. The output $S_0$ delivers a logic zero. The SRAM construction may allow applying only a zero signal at BL or BS to write data into the latch. The SRAM cell may have only one access transistor 301 or 302. The SRAM latch will hold the data state as long as power is on. When the power is turned off, the SRAM bit needs to be restored to its previous state from an outside permanent memory. In the literature for programmable logic, this second non-volatile memory is also called configuration memory. Upon power up, an external or an internal CPU loads the external configuration memory to internal configuration memory locations. All of FPGA functionality is controlled by the internal configuration memory. The SRAM configuration circuit in FIG. 3A controlling logic pass-gate is illustrated in FIG. 3B. Element 350 represents the configuration circuit. The $S_0$ output directly driven by the memory element in FIG. 3A drives the pass-gate 310 gate electrode. In addition to $S_0$ output and the memory cell, power, ground, data in and write enable signals in 350 constitutes the SRAM configuration circuit. Write enable circuitry includes GA, GB, BL, BS signals shown in FIG. 3A.

Structured ASIC described in U.S. Pat. No. 6,331,789 contains SRAM based 3-input LUTs to enhance logic flexibility similar to FPGAs described in U.S. Pat. No. 4,706,216, U.S. Pat. No. 4,870,302, U.S. Pat. No. 5,488,316, U.S. Pat. No. 5,343,406, U.S. Pat. No. 5,844,422 and U.S. Pat. No. 6,134,173. LUT programmability at silicon substrate level may reduce the number of wires required to connect all the modules at an upper metal layer. Packing logic into 3-input or 4-input pre-fabricated LUTs is fairly inefficient and costly compared to the logic element shown in FIG. 1A. Clock skew and track inefficiencies are still encountered during simulation and difficult to fix with these devices. Once the metal is hard-wired to a suitable logic placement, the structured ASIC is very inflexible to design tweaks and changes. Module function, module placements and wire connections all change during a timing or cost driven optimization of a design. When the wires are fixed, there is no method to change the module placement in the fixed module locations. Thus programmable LUT based structured cells add little value over hard-wire structured cells shown in FIG. 1. They both provide no off-the-shelf emulation device, like an FPGA, where the customer can change and tweak a design in real Silicon. Such an emulation device could be plugged into a system debug board and further used for early design wins and provided to customers as first samples.

What is desirable is to have programmable version to a structured ASIC device at the beginning of a design cycle. The user can program such an off-the-shelf device, place logic and routing at an optimal location to improve timing or cost of said design. The flexibility is further enhanced when the logic element contains programmable elements such as LUTs. For an emulation device, the cost of programmability is not a concern if such a device lends to easy design porting to a hard-wire low cost version once the design is finalized. Such a conversion has to keep the timing of the original design intact to avoid valuable re-engineering time and cost. Such a conversion should lower the end product cost to be competitive with an equivalent standard cell ASIC cost for design opportunities that forecast fairly significant volumes. These programmable structured ASIC devices will target applications that are cost sensitive, have short life cycles and demand volumes larger than for typical FPGA designs and lower than for typical ASIC designs.

SUMMARY

In one aspect, a programmable semiconductor device includes a programmable switch to couple two nodes; and a configurable element to program said switch wherein the configurable element and the switch are positioned above or below a transistor element constructed on a semiconductor substrate layer.

In another aspect, programmable semiconductor device includes a user programmable switch comprising a configurable element and a device to configure the element are positioned above or below a transistor element constructed on a semiconductor substrate layer.

In yet another aspect, a programmable semiconductor device includes a programmable switch comprising a configurable element is positioned above or below a transistor element.

Implementations of the above aspects may include one or more of the following. A semiconductor integrated circuit comprises an array of structured sells or modules. These modules may use one or more metal layers to partially connect them. A programmable interconnect structure may be used to customize a specific interconnect pattern by the user. Said interconnect structure is formed above said structured cell array. In one embodiment, the programmable structure may include the upper most metal layer. In a second embodiment, additional metal layers may be formed above said interconnect structure to complete the functionality of the integrated circuit and form connections to input and output pads. Said interconnect structure comprises a programmable switch. Most common switch is a pass-gate device. A pass-gate is an NMOS transistor, a PMOS transistor or a CMOS transistor pair that can electrically connect two points. Other methods of connecting two points include fuse links and anti-fuse capacitors. Yet other methods to connect two points may include an electrochemical cell. Programming these devices include forming one of either a conducting path or a non-conducting path.

The gate electrode signal on said pass-gates allows a programmable method of controlling an on and off connection. A plurality of pass-gate logic is included in said wire programmable structure. The structure may include circuits consisting of CMOS transistors comprising AND, NAND, INVERT, OR, NOR and pass-gate type logic circuits. Multiple logic circuits may be combined into a larger logic block. Configuration circuits are used to change programmable wire connectivity. Configuration circuits have memory elements and access circuitry to change memory data. Each memory element can be a transistor or a diode or a group of electronic devices. The memory elements can be made of CMOS devices, capacitors, diodes, resistors and other electronic components. The memory elements can be made of thin film devices such as thin film transistors (TFT), thin-film capacitors and thin-film diodes. The memory element can be selected from the group consisting of volatile and non volatile memory elements. The memory element can also be selected from the group comprising fuses, antifuses, SRAM cells, DRAM cells, optical cells, metal optional links, EPROMs, EEPROMs, flash, magnetic and ferro-electric elements. One or more redundant memory elements can be provided for controlling the same circuit block. The memory element can generate an output signal to control pass-gate logic. Memory element can generate a signal that is used to derive a control signal. The control signal is coupled to pass-gate logic element, AND array, NOR array, a MUX or a Look-Up-Table (LUT) logic.

Structured cells are fabricated using a basic logic process capable of making CMOS transistors. These transistors are formed on P-type, N-type, epi or SOI substrate wafer. Configuration circuits, including configuration memory, constructed on same silicon substrate take up a large Silicon foot print. That adds to the cost of programmable wire structure compared to a similar functionality custom wire structure. A 3-dimensional integration of pass-gate and configuration circuits to connect wires provides a significant cost reduction. The pass-gates and configuration circuits may be constructed above one or more metal layers. Said metal layers may be used for intra and inter connection of structured cells. The programmable wire circuits may be formed above the structured cell circuits by inserting a thin-film transistor (TFT) module. Said TFT module may be inserted at any via layer, in-between two metal layers of a logic process. The TFT module may include one or more metal layers for local interconnect between TFT transistors. The TFT module may include salicided poly-silicon local interconnect lines. The thin-film memory outputs may be directly coupled to gate electrodes of thin-film pass-gates to provide programmable wire control. The TFT module may have buried contacts to short gate poly to active poly. These buried contacts may facilitate thin-film interconnect inside the TFT module. Via thru-holes may be used to connect TFT module to underneath metal. The thru-holes may be filled with Titanium-Tungsten, Tungsten, Tungsten Silicide, or some other refractory metal. The thru-holes may contain Nickel to assist Metal Induced Laser Crystallization (MILC) in subsequent processing. Memory elements may be constructed also with TFT transistors, capacitors and diodes. The TFT layers may be restricted for only for programmable wire connections. Metal layers above the TFT layers may be used for all the other routing. This simple vertically integrated pass-gate switch and configuration circuit reduces programmable wire cost.

In a second aspect, a wire structure for an integrated circuit having two selectable methods of connecting wires, comprises: a first selectable method comprising programmable switches, each said switch coupling a wire in a first set to a wire in a second set, and said method providing a means to program a user defined interconnect pattern between said first and second set of wires; and a second selectable method comprising permanent connections in lieu of said switches, said permanent connection pattern duplicating one of said user defined interconnect patterns.

Implementations of the above aspect may include one or more of the following. A programmable wire structure provides switches for a user to customize the interconnect pattern in a structured ASIC. This is provided to the user in an off the shelf programmable wire product. There is no waiting and time lost to port a synthesized logic design into a programmable wire device. This reduces time to solution (TTS) by 6 months to over a year. A programmable wire structure has the customization circuitry confined to a TFT layer above the fixed structured cell layer. This TFT module may be inserted to a logic process. Manufacturing cost of TFT layers add extra cost to the finished product. Once the programming is finalized by the user, the final interconnect pattern is fixed for most designs during product life cycle. Programmable wire circuits are no longer needed. The user can convert the design to a lower cost hard-wire custom device with an identical interconnect pattern. The programmed connection is mapped to a metal connection in the hard-wire option. This may be done with a single metal mask in lieu of all of TFT layers in the second module. The first module with structured cells does not change by this conversion. A third module may exist above the second module to complete interconnect for functionality of the end device. The third module also does not change with the second module option. The propagation delays and critical path timing may be substantially identical between the two second module options. The TFT layers may allow a higher power supply voltage for the user to emulate performance at reduced pass-gate resistances. Such emulations may predict potential performance improvements for TFT pass-gates and hard-wired connected options. Duplicated hard-wire pattern may be done with a customized thruhole mask. Customization may be done with a thru-hole and a metal mask or a plurality of thru-hole and metal masks. Hard wire pattern may also improve reliability and reduce defect density of the final product. The hard-wire pattern provides a cost economical final structured ASIC to the user at a very low NRE cost. The total solution provides a programmable and customized solution to the user.

In a third aspect, a semiconductor device for integrated circuits with two selectable manufacturing configurations, comprises: a first module layer having an array of structured cells, said module layer having at least one layer of metal; and a second module layer formed substantially above said first module layer comprising two selectable configurations, wherein: in a first selectable configuration a programmable interconnect structure is formed to connect said structured cells, and in a second selectable configuration a customized interconnect structure is formed to connect said structured cells.

Implementations of the above aspect may further include one or more of the following. The programmable interconnect structure comprises a memory element that can be selected from the group consisting of volatile or non volatile memory elements. The memory can be implemented using a TFT process technology that contains one or more of Fuses, Anti-fuses, DRAM, EPROM, EEPROM, Flash, Ferro-Electric, optical, magnetic and SRAM elements. Configuration circuits may include thin film elements such as diodes, transistors, resistors and capacitors. The process implementation is possible with any memory technology where the programmable element is vertically integrated in a removable module. The configuration circuit includes a predetermined conductive pattern in lieu of memory elements to control the logic in the structured circuits. The structured circuits may themselves be programmable with its own programmable module separate from the wire programmable module. Multiple memory bits exist to customize wire connections. Each memory bit pattern has a corresponding unique conductive pattern to duplicate the same logic connections. Circuit performance of the logic connection is not affected by the choice of connecting option: programmable pass-gates or conductive pattern.

The programmable interconnect structure constitutes fabricating a VLSI IC product. The IC product is re-programmable in its initial stage with turnkey conversion to a one mask customized ASIC. The IC has the end ASIC cost structure and initial FPGA re-programmability. The IC product offering occurs in two phases: the first phase is a generic FPGA that has re-programmability contained in a programmable wire structure, and a second phase is an ASIC that has the entire programmable module replaced by one or two customized hard-wire masks. Both FPGA version and turnkey custom ASIC has the same base die. The vertically integrated programmable module does not consume valuable silicon real estate of a base die. Furthermore, the design and layout of these product families adhere to removable module concept: ensuring the functionality and timing of the product in its FPGA and ASIC canonicals. These IC products can replace existing PLD's, CPLD's, FPGA's, Gate Arrays, Structured ASIC's and Standard Cell ASIC's. An easy turnkey customization of an end ASIC from an original smaller cheaper and faster programmable structured array device would greatly enhance time to market, performance, product reliability and solution cost.

BRIEF DESCRIPTION OF THE DRAWINGS

FIG. 7.1-7.7 shows process cross-sections of one embodiment to integrate thin-film transistors into a logic process in accordance with the current invention.

FIG. 7.8 shows one embodiment of incorporating seed metal into a thru-hole prior to TFT formation: pre and post plug CMP via cross sections.

FIG. 7.9 shows a second embodiment of incorporating seed metal into a thru-hole prior to TFT formation: pre and post plug CMP via cross sections.

DESCRIPTION

Figure 1A:
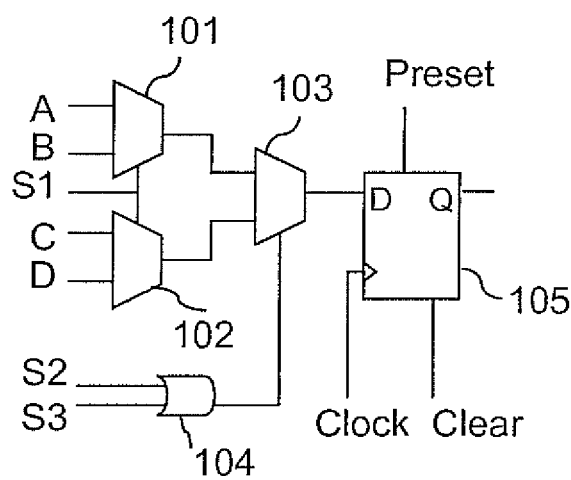
FIG. 1A shows an exemplary logic element or a structured module.
Figure 1B:
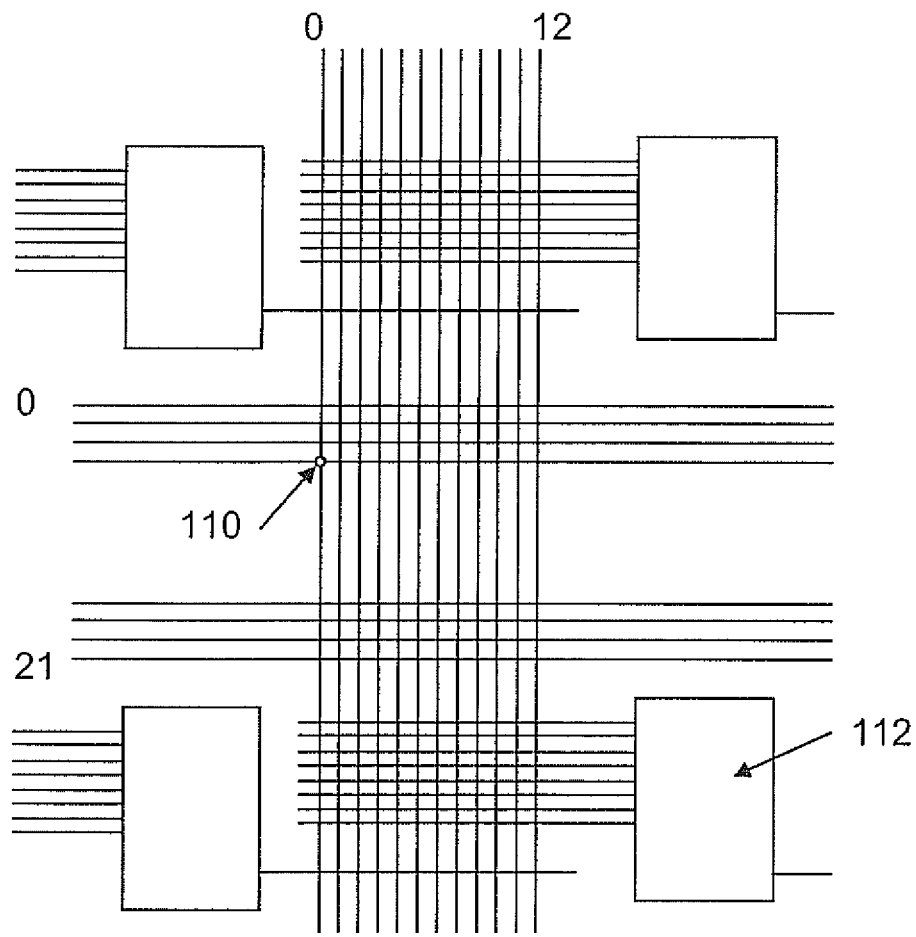
FIG. 1B shows an exemplary programmable wire structure utilizing a structured cell.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Definitions: The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors.

The term module layer includes a structure that is fabricated using a series of predetermined process steps. The boundary of the structure is defined by a first step, one or more intermediate steps, and a final step. The resulting structure is formed on a substrate.

The term pass-gate and switch refers to a structure that can pass a signal when on, and block signal passage when off. A pass-gate (and switch) connects two points when on, and disconnects two points when off. A pass-gate can be a floating-gate transistor, an NMOS transistor, a PMOS transistor, a CMOS transistor pair, or a conductivity modulator element. The gate electrode of pass-gate or the conductivity of conductivity modulator element determines the state of the connection. A CMOS pass-gate requires complementary signals coupled to NMOS and PMOS gate electrodes. A control logic signal is connected to gate electrode of NMOS, PMOS &

CMOS. Charge is trapped on floating gates. Conductivity is modulated in Ferro-electric & electro-chemical elements.

The term configuration circuit includes one or more configurable elements and connections that can be programmed for controlling one or more circuit blocks in accordance with a predetermined user-desired functionality. The configuration circuit includes the memory element and the access circuitry, herewith called memory circuitry, to modify said memory element. Configuration circuit does not include the logic pass-gate controlled by said memory element. In one embodiment, the configuration circuit includes a plurality of memory circuits to store instructions to configure an FPGA. In another embodiment, the configuration circuit includes a first selectable configuration where a plurality of memory circuits is formed to store instructions to control one or more circuit blocks. The configuration circuits include a second selectable configuration with a predetermined conductive pattern formed in lieu of the memory circuit to control substantially the same circuit blocks. The memory circuit includes elements such as diode, transistor, resistor, capacitor, metal link, among others. The memory circuit also includes thin film elements. In yet another embodiment, the configuration circuits include a predetermined conductive pattern, via, resistor, capacitor or other suitable circuits formed in lieu of the memory circuit to control substantially the same circuit blocks.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense.

Figure 3A:
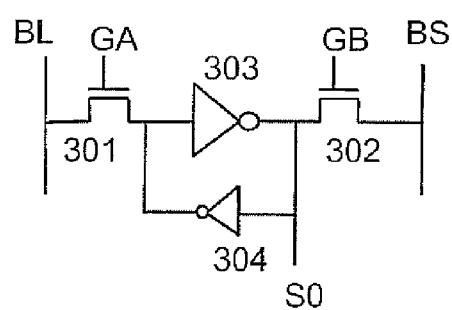
FIG. 3A shows an exemplary configuration circuit for a 6T SRAM element.
Figure 3B:
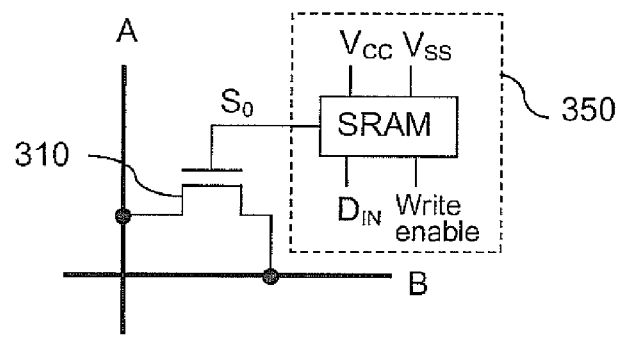
FIG. 3B shows an exemplary programmable pass-gate switch with SRAM memory.

An SRAM based point to point connection is shown in FIG. 3. The point to point connection is made by utilizing a programmable pass-gate and a configuration circuit as shown in FIG. 3B and FIG. 3A. Multiple inputs (node A) can be connected to multiple outputs (node B) with a plurality of pass-gate logic elements. In FIG. 3B, pass-gate 310 can be a PMOS or an NMOS transistor. NMOS is preferred due to its higher conduction. The gate voltage $S_0$ on NMOS transistor 310 gate electrode determines an ON or OFF connection. That logic level is generated by a configuration circuit 350 coupled to the gate of NMOS transistor 310. The pass-gate logic connection requires the configuration circuitry to generate signal $S_0$ with sufficient voltage levels to ensure off and on conditions. For an NMOS pass-gate, $S_0$ having a logic level one completes the point to point connection, while a logic level zero keeps them disconnected. In addition to using only an NMOS gate, a PMOS gate could also be used in parallel to make the connection. The configuration circuit 350 needs to then provide complementary outputs ($S_0$ and $S_0'$) to control NMOS and PMOS gates in the connection. Configuration circuit 350 contains a memory element. Most CMOS SRAM memory delivers complementary outputs. This memory element can be configured by the user to select the polarity of $S_0$, thereby selecting the state of the connection. The memory element can be volatile or non-volatile. In volatile memory, it could be DRAM, SRAM, Optical or any other type of a memory device that can output a valid signal $S_0$. In non-volatile memory it could be fuse, anti-fuse, EPROM, EEPROM, Flash, Ferro-Electric, Magnetic or any other kind of memory device that can output a valid signal $S_0$. The output $S_0$ can be a direct output coupled to the memory element, or a derived output in the configuration circuitry. An inverter can be used to restore $S_0$ signal level to fall rail voltage levels. The SRAM in configuration circuit 350 can be operated at an elevated Vcc level to output an elevated $S_0$ voltage level. This is especially feasible when the SRAM is built in a separate TFT module. Other configuration circuits to generate a valid $S_0$ signal are discussed next.

Figure 4:
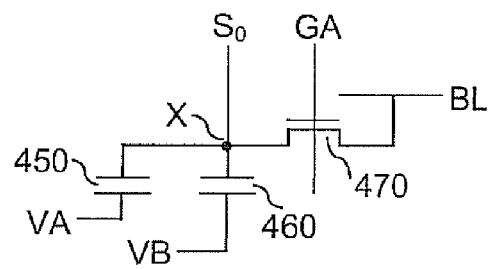
FIG. 4 shows a configuration circuit utilizing anti-fuse memory elements.

An anti-fuse based configuration circuit to use with this invention is shown next in FIG. 4. Configuration circuit 350 in FIG. 3B can be replaced with the anti-fuse circuit shown in FIG. 4. In FIG. 4, output level $S_0$ is generated from node X which is coupled to signals VA and VB via two anti-fuses 450 and 460 respectively. Node X is connected to a programming access transistor 470 controlled by gate signal GA and drain signal BL. A very high programming voltage is needed to blow the anti-fuse capacitor. This programming voltage level is determined by the anti-fuse properties, including the dielectric thickness. Asserting signal VA very high, VB low (typically ground), BL low and GA high (Vcc to pass the ground signal) provides a current path from VA to BL through the on transistor 470. A high voltage is applied across anti-fuse 450 to pop the dielectric and short the terminals. Similarly anti-fuse 460 can be programmed by selecting VA low, VB very high, BL low and GA high. Only one of the two anti-fuses is blown to form a short. When the programming is done, BL and GA are returned to zero, isolating node X from the programming path. VA=Vss (ground) and VB=Vcc (power, or elevated Vcc) is applied to the two signal lines. Depending on the blown fuse, signal $S_0$ will generate a logic low or a logic high signal. This is a one time programmable memory device. Node X will be always connected to VA or VB by the blown fuse regardless of the device power status. Signals GA and BL are constructed orthogonally to facilitate row and column based decoding to construct these memory elements in an array.

Figure 5A:
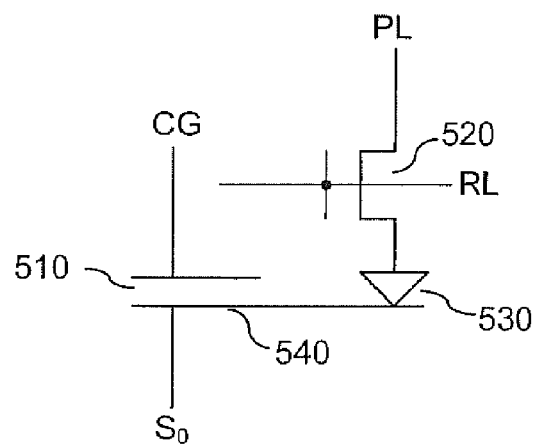
FIG. 5A shows a first embodiment of a configuration circuit utilizing a floating-gate.
Figure 5B:
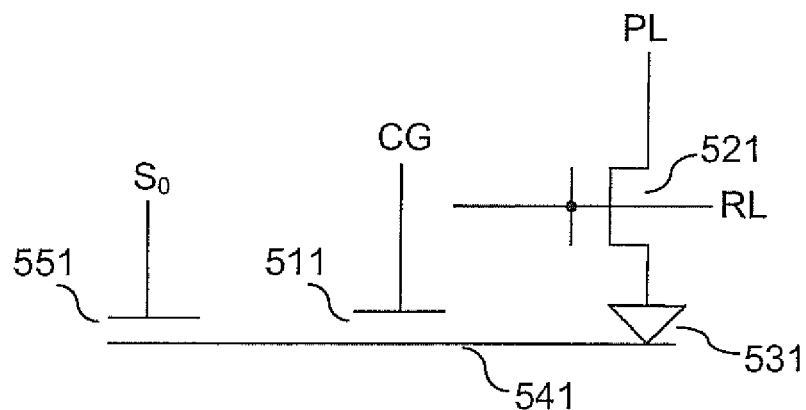
FIG. 5B shows a second embodiment of a configuration circuit utilizing a floating-gate.

FIG. 5 shows two EEPROM non-volatile configuration circuits that can be used in this invention. Configuration circuit 350 in FIG. 3B can be replaced with either of two EEPROM circuit shown in FIG. 5A and FIG. 5B. In FIG. 5A, node 540 is a floating gate. This is usually a poly-silicon film isolated by an insulator all around. It is coupled to the source end of programming transistor 520 via a tunneling diode 530. The tunneling diode is a thin dielectric capacitor between floating poly and substrate silicon with high doping on either side. When a large programming (or erase) voltage Vpp is applied across the thin dielectric, a Fowler-Nordheim tunneling current flows through the oxide. The tunneling electrons move from electrical negative to electrical positive voltage. Choosing the polarity of the applied voltage across the tunneling dielectric, the direction of electron flow can be reversed. Multiple programming and erase cycles are possible for these memory elements. As the tunneling currents are small, the high programming voltage (Vpp) can be generated on chip, and the programming and erasure can be done while the chip is in a system. It is hence called in system programmable (ISP). An oxide or dielectric capacitor 510 couples the floating gate (FG) 540 to a control gate (CG). The control gate CG can be a heavily doped silicon substrate plate or a second poly-silicon plate above the floating poly. The dielectric can be oxide, nitride, ONO or any other insulating material. A voltage applied to CG will be capacitively coupled to FG node 540. The coupling ratio is designed such that 60-80 percent of CG voltage will be coupled to FG node 540. To program this memory element, a negative charge must be trapped on the FG 540. This is done by applying positive Vpp voltage on CG, ground voltage on PL and a sufficiently high (Vcc) voltage on RL. CG couples a high positive voltage onto FG 540 creating a high voltage drop across diode 530. Electrons move to the FG 540 to reduce this electric field. When the memory device is returned to normal voltages, a net negative voltage remains trapped on the FG 540. To erase the memory element, the electrons must be removed from the floating gate. This can be done by UV light, but an electrical method is more easily adapted. The CG is grounded, a very high voltage (Vpp+more to prevent a threshold voltage drop across 520) is applied to RL, and a very high voltage (Vpp) is applied to PL. Now a low voltage is coupled to FG with a very high positive voltage on the source side of device 520. Diode 530 tunneling removes electrons from FG. This removal continues beyond a charge neutral state for the isolated FG. When the memory device is returned to normal voltages, a net positive voltage remains trapped on the FG 540. Under normal operation RL is grounded to isolate the memory element from the programming path, and PL is grounded. A positive intermediate voltage Vcg is applied to CG terminal. FG voltage is denoted $S_0$. Under CG bias, $S_0$ signal levels are designed to activate pass-gate logic correctly. Configuration circuit in FIG. 5B is only different to that in FIG. 5A by the capacitor 551 used to induce $S_0$ voltage. This is useful when $S_0$ output is applied to leaky pass-gates, or low level leakage nodes. As gate oxide thicknesses reach below 50 angstroms, the pass-gates leak due to direct tunneling. These configuration circuits, and similarly constructed other configuration circuits, can be used in programmable logic devices. Those with ordinary skill in the art may recognize other methods for constructing configuration circuits to generate a valid $S_0$ output.

SRAM memory technology has the advantage of not requiring a high voltage to configure memory. Discounting the pass-gate 310, the SRAM memory circuit shown in FIG. 3A utilizes 6 extra configuration transistors to provide programmability. That is a significant overhead compared to application specific circuits where the point to point connection can be directly made with metal. Similarly other programmable memory elements capable of configuring pass-gate logic also carry a high silicon foot print. A cheaper method of constructing a vertically integrated SRAM cell is described in incorporated by reference application Ser. No. 10/413,810 entitled "Semiconductor Latches and SRAM Devices". For this present application, in a preferred embodiment, both the pass-gate and the configuration circuit are built on thin-film semiconductor layers located vertically above the structured array circuits. The SRAM memory element, a thin-film transistor (TFT) CMOS latch as shown in FIG. 3A, comprises two back to back inverters formed on dual semiconductor thin film layers, substantially different from a semiconductor substrate layer and a gate poly layer used for structured array transistor construction. By constructing a programmable connectivity layer between any two metal layers, the wires do not need to go down to silicon substrate transistors to complete a connection, saving considerable routing area for the device. Multiple connectivity layers can be sandwiched between metal layers to provide a plurality of programming interconnect structures for the device. The programmable wire transistors sandwiched between two metal layers facilitate connections between two lower layer metal wires, two upper layer metal wires or a lower layer and an upper layer metal wire. The programmable wire connection is stacked above the structured array circuits with no penalty on Silicon area and cost. The die size is determined by the structured array foot-print. This allows the end ASIC where programmable wires are replaced by hard-wires to have the same cost as a stand alone structured ASIC device. The SRAM latch is adapted to receive power and ground voltages in addition to configuration signals. The two programming access transistors for the TFT latch are also formed on thin-film layers. Thus in FIG. 3B, pass-gate 310 and all six configuration transistors shown in 350 are constructed in TFT layers, vertically above the structured array cells. Transistor 310 is in the conducting path of the connection and needs to be a high performance transistor. This is accomplished by Metal Induced Laser Crystallization (MILC) of the first polysilicon thin film used for the transistors. The vertical integration makes it economically feasible to add SRAM based programmable wire circuits to a structured ASIC at a low manufacturing cost overhead to provide a programmable platform. Such vertical integration can be extended to any other memory element besides SRAM memory that can be constructed in TFT layers above structured array circuits.

New programmable logic devices utilizing thin-film transistor configurable circuits are disclosed in incorporated by reference application Ser. No. 10/267,483, application Ser. No. 10/267,484 and application Ser. No. 10/267,511. Those three disclosures describe a programmable logic device and an application specific device fabricated from the same base Silicon die. The PLD is fabricated with a programmable memory module, while the ASIC is fabricated with a conductive pattern in lieu of the memory. Both memory module and conductive pattern provide identical control of logic circuits that are formed on a substrate layer. For each set of programmable memory bit patterns, there is a unique conductive pattern to achieve the same underlying logic functionality. The vertical integration of the configuration circuit leads to a significant cost reduction for the PLD, and the elimination of TFT memory for the ASIC allows an additional cost reduction for the user. In the three disclosures, the pass-gate connecting device is fabricated on substrate silicon and only the configuration circuit is fabricated in TFT layers. Such construction helps to keep the speed path of timing circuits completely unchanged between the programmable and the customized options. For some multi metal devices, constructing a wire connecting pass-gate in silicon substrate is constrictive. A wire from an upper metal has to reach the silicon substrate many layers vertically below, taking up extra vertical connections in addition to occupying substrate silicon area for the pass-gate. Present novel Programmable Structured Array disclosure describes a programmable wire structure that combines both pass-gate connecting device and configuration circuit into one replaceable TFT module. Furthermore, the methodology disclosed is easily extendable to a plurality of programmable TFT modules sandwiched between multiple pairs of metal layers. Each TFT module may be located between any two metal layers in a vertical stack. The programmable TFT module may be replaced with a hard-wire module to retain identical functionality between the two options. The TFT based pass-gate and memory integration to achieve said programmable wire structure is briefly described next. A TFT transfer gate integration in an FPGA is disclosed in U.S. Pat. No. 6,515,511, wherein the significant configuration circuit overhead including memory elements are located in a substrate layer. Furthermore, the disclosure shows no method to convert said programmable device to a cheaper hard-wire option. Such integration does not lend to a low cost structured array programmable wire structure and economical same-die convertibility to a hard-wire structured ASIC.

Figure 6:
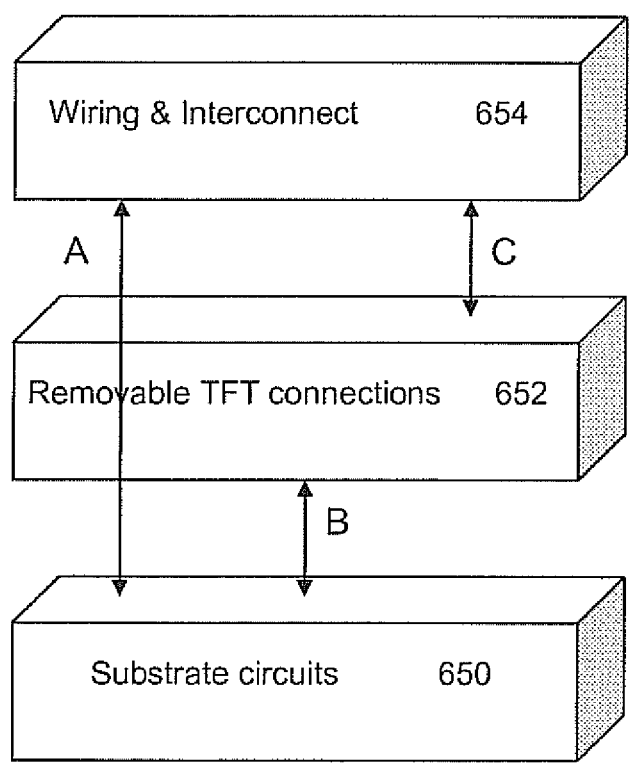
FIG. 6 shows a 3-dimensional construction of a programmable wire structure.

FIG. 6 shows an implementation of vertically integrated circuits, where the programmable wire structure 652 is located above substrate circuits 650. The structured array is constructed as substrate circuits 650. The structured array comprises NMOS, PMOS transistors & memory components and wires to form portions of circuit blocks and structured cells. The TFT module 652 comprises NMOS, PMOS, Diodes, Capacitors, Memory, Wires and other thin film components to form programmable wire circuits. The memory element for the programmable wire module can be any one of fuse links, anti-fuse capacitors, SRAM cells, DRAM cells, metal optional links, EPROM cells, EEPROM cells, flash cells, ferro-electric elements, electro-chemical cells, optical elements and magnetic elements that lend to this implementation. SRAM memory is used herein to illustrate the scheme and is not to be taken in a limiting sense. First, silicon transistors are deposited on a substrate in a first module layer 650. These transistors include NMOS, PMOS and other electronic devices. The first module may also contain contacts and metal wires that connect transistors to each other to form partial circuit blocks. This structured array may include cells illustrated in FIG. 1A. These cells capable of performing logic functions have one or more inputs and outputs. Not all inputs and outputs are connected to each other in said first module. All inputs and outputs are however connected to a top metal node that denotes the last step of the first module 650. A module layer of removable TFT connections 652 comprising pass-gates and SRAM cells are positioned above the substrate circuits. These TFT circuits facilitate programmable connections between inputs and outputs of said first module. These connections are constructed as programmable switches between a first set of wires and a second set of wires. The first set of wires contains connections to inputs and outputs of cells in said first module. The second set of wires provides functional connections to customize an interconnect pattern. In a preferred embodiment, an additional third module layer of interconnect wiring or routing circuit 654 is formed above the removable TFT connections 652. The programmable TFT module provides programmable connectivity between two metal wires in said first module, two metal wires in said third module, and a metal wire in said first module to a metal wire in said third module. The programmable TFT module is replaceable with a hard-wire metal layer. To allow this replacement, the design adheres to a hierarchical layout structure. As shown in FIG. 6, the TFT module is sandwiched between the substrate circuit layers below and the metal layers above electrically connecting to both. It also provides through connections "A" for the lower device layers to upper metal layers. The TFT module contains all circuits required for the user to configure connections between two sets of wires. All other routing is in the layers above and below. Most of the programmable element configuration signals run inside the TFT module. TFT module connects to upper metal layers via connections "C" and to substrate layers via Connections "B". Most of the replaceable programmable elements and its configuration wiring is in the "replaceable module" while all the fixed devices and fixed wiring for the end ASIC is outside the "replaceable module". In other embodiments, the replaceable module could exist between any two metal layers or as the top most module layer satisfying the same device and routing constraints. This description is equally applicable to any other configuration memory element, and not limited to SRAM cells.

Fabrication of the IC also follows a modularized device formation. Formation of substrate circuits 650 and routing 654 is by utilizing a standard logic process flow used in the ASIC fabrication. Extra processing steps used for TFT module 652 fabrication are inserted into the logic flow after circuit layer 650 is constructed. A full discussion of the vertical integration of the TFT module using extra masks and extra processing is described next.

The fabrication of thin-film transistors to construct configuration circuits is disclosed in incorporated by reference application Ser. No. 10/413,809 entitled "Semiconductor Switching Devices". The following terms used herein are acronyms associated with certain manufacturing processes. The acronyms and their abbreviations are as follows:

$V_T$ Threshold voltage
LDN Lightly doped NMOS drain
LDP Lightly doped PMOS drain
LDD Lightly doped drain
RTA Rapid thermal annealing
Ni Nickel
Ti Titanium
TiN Titanium-Nitride
TiW Titanium-Tungsten
W Tungsten
S Source
D Drain
G Gate
ILD Inter layer dielectric
IMD Inter metal dielectric
C1 Contact-1
M1 Metal-1
GP Gate poly
P1 Poly-1
P− Positive light dopant (Boron species, $BF_2$)
N− Negative light dopant (Phosphorous, Arsenic)
P+ Positive high dopant (Boron species, $BF_2$)
N+ Negative high dopant (Phosphorous, Arsenic)
Gox Gate oxide
C2 Contact-2
LPCVD Low pressure chemical vapor deposition
CVD Chemical vapor deposition
ONO Oxide-nitride-oxide
LTO Low temperature oxide
MILC Metal induced laser crystallization A logic process is used to fabricate CMOS devices on a substrate layer for the fabrication of structured array circuits. These CMOS devices may be used to build AND gates, OR gates, inverters, adders, multipliers, memory and pass-gate based logic functions in an integrated circuit. These circuits may include programmable logic circuits. Then a TFT module layer capable of providing CMOSFET transistors or Complementary Gated FET (CGated-FET) transistors is inserted to said logic process in between two metal layers to construct a second set of complementary transistors. Compared with CMOS devices, CGated FET devices are bulk conducting devices and work on the principles of JFETs. A full disclosure of these devices is provided in incorporated by reference application Ser. No. 10/413,808 entitled "Insulated-Gate Field-Effect Thin Film Transistors". Pass-gate connections and configuration circuitry is build with these second set of transistors. An exemplary logic process in which TFT module is inserted after metal-2 layer may include one or more following steps:

P-type substrate starting wafer
Shallow Trench isolation: Trench Etch, Trench Fill and CMP
Sacrificial oxide
PMOS $V_T$ mask & implant
NMOS $V_T$ mask & implant
Pwell implant mask and implant through field
Nwell implant mask and implant through field
Dopant activation and anneal
Sacrificial oxide etch
Gate oxidation/Dual gate oxide option
Gate poly (GP) deposition GP mask & etch
LDN mask & implant
LDP mask & implant
Spacer oxide deposition & spacer etch
N+ mask and NMOS N+G, S, D implant
P+ mask and PMOS P+G, S, D implant
Ni deposition
RTA anneal—Ni salicidation (S/D/G regions & interconnect)
Unreacted Ni etch
ILD oxide deposition & CMP
Contact mask & etch
Contact plug fill & CMP
Metal-1 deposition
Metal-1 mask and etch
IMD-1 oxide deposition & CMP
Via-1 mask & etch
Via-1 plug fill & CMP
Metal-2 deposition
Metal-2 mask and etch
IMD-2 oxide deposition & CMP After IMD-2 is formed TFT CGated-FET transistors are formed by inserting a TFT process module. This module has to be compatible with the prior logic processing requirements. Programmable wire connections formed in this TFT layer connects metal-2 to metal-2, metal-2 to metal-3 and metal-3 to metal-3. FIG. 7 shows the process cross-sections for a preferred embodiment of a TFT process to fabricate thin film pass-gates and SRAM latches. In other embodiments of the process shown in FIG. 7, the TFT module is inserted between any two metal layers. In yet another embodiment, CMOS FET transistors are built on TFT module to form the programmable wire connections. In yet other embodiments, different processing steps may be used to construct complementary transistors and memory elements to construct programmable circuitry in said TFT module. The processing sequence in FIG. 7.1 through 7.7 describes the physical construction of complementary Gated-FET devices for pass-gate 310 and storage circuits 350 shown in FIG. 3B. The process shown in FIG. 7 includes adding one or more following steps to the exemplary logic process discussed earlier after IMD-2 oxide deposition and CMP step.

Via-2 mask & etch
Via-2 plug fill: Ti, TiN, W, and seed Ni deposition
Via-2 plug CMP (Ni filling the center of polished via-2)
~300 A poly-1 (amorphous Polysilicon-Germanium) deposition
Blanket Vtn N− implant (Gated-NFET $V_T$)
Vtp mask & P− implant (Gated-PFET $V_T$)
Metal induced laser crystallization (MILC) for single crystal growth
TFT Gox (70A PECVD) deposition
Buried contact (BC) mask and Gox etch
500 A P2 (crystalline poly-2) deposition
Blanket P+ implant (Gated-NFET gate & interconnect)
N+ mask & implant (Gated-PFET gate & interconnect)
P2 mask & etch
Blanket LDN Gated-NFET N tip implant
LDP mask and Gated-PFET P tip implant
Spacer LTO deposition
Spacer LTO etch to form spacers & expose P1
Ni deposition and RTA salicidation
Fully salicidation of exposed P1 S/D regions
LDN, LDP, N+, and P+ dopant activation anneal
Excess Ni etch
IMD-3 oxide deposition & CMP
Via-3 mask & etch
W plug formation & CMP
M4 deposition and back end metallization The TFT process steps described consists of creating Gated-NFET & Gated-PFET poly-silicon transistors. After a pre-selected metal layer is patterned and etched, the subsequent IMD is deposited, and polished by CMP techniques to a desired thickness. In the shown embodiment in FIG. 7, TFT module is inserted after metal-2. Via-2 mask is defined and etched. The Via-2 plug formation is modified from typical processing techniques to include Ni metal to help reduce poly crystallization temperature. In other embodiments, the Via-2 plug may have a different seed metal to assist MILC, or have no seed metal at all. Lowering temperature makes the TFT module compatible with Aluminum and Copper metallization schemes used in sub 0.18 micron technologies. In a first embodiment shown in FIG. 7.8A, Via-2 is filled with Ti 701, TiN 702 for the glue layer followed by W 703 and Ni 704 deposition to fill the plugs. The W 703 thickness is chosen to cover most of the via-hole with W and for Ni 704 to fill just the center. Wafer surface is then CMP polished as shown in FIG. 7.8B to leave the fill materials only in the Via-2 holes. After the polish, Ni is located only at the very center of Via-2 holes. In a second embodiment shown in FIG. 7.9A, Via-2 is filled with Ti 711, TiN 712 for the glue layer followed by Ni 714 and W 713 deposition to fill the plugs. The Ni 714 thickness is chosen to thinly cover Ti/TiN glue layer, and for W 713 to completely fill the via-hole. Wafer surface is then CMP polished as shown in FIG. 7.9B to leave the fill materials only in the Via-2 holes. After the polish, Ni is located as a thin ring adjacent to Ti/TiN glue layer inside the Via-2 holes. These methods and others easily adapted by one skilled in the art provides Ni nucleation sites inside the via-holes to grow single crystal grains from deposited poly silicon during a later MILC step. The thickness of Ni is controlled to form Nickel-Salicide only near the proximity of the via-hole.

Then, a first amorphous P1 poly layer is deposited by LPCVD to a desired thickness as shown in FIG. 7.1. In the preferred embodiment, P1 is mixed with germanium to lower the temperature required for poly crystallization. The P1 thickness is between 50 A and 1000 A, and preferably between 200 A and 300 A. This poly layer P1 is used for the channel, source, and drain regions for both Gated-NFET and Gated-PFET TFT's. P1 is implanted with blanket N− $V_T$ adjust implant for Gated-NFET devices followed by a masked P− $Y_T$ adjust implant for Gated-PFET devices. The first doping can also be done in-situ during poly deposition instead of the blanket implant shown in FIG. 7.1. As the P1 thickness is small, a uniform doping profile is obtained in the body. The implant doses and P1 thickness are optimized to get the required threshold voltages for Gated-PFET & Gated-NFET devices. These parameters are further optimized to completely turn off devices by fully depleting transistor body regions, and improve transistor on to off current ratios. In another embodiment CMOS transistors are formed on this P1 body region, wherein thresholds adjust implants and P1 film thickness are optimized for those device performances. In a first embodiment the P1 film is laser crystallized by standard MILC techniques. Germanium mixing with polysilicon and the presence of Ni nucleation sites at every via-2 center reduces the poly crystallization temperatures below that mandated by previously deposited metal layers. Single crystal formation of thin film P1 provides a high mobility, low resistance pass-gate switch to connect wires. In a second embodiment, the P1 crystallization is done after the P1 is etched into islands. In the later approach, each P1 island has at least one Via-2 with Ni at the center of via as seed material. P1 in each island grows into a single grain with the single grain emanating from the Ni Salicidation from via center.

P1 is patterned and etched to form the transistor body regions as shown in FIG. 7.2. In the shown embodiment, P1 is also used for Via-2 top pedestals. In other embodiments, Via-3 plugs are directly stacked on Via-2 plugs without the need for poly pedestals in between via. The pedestals may be implanted at a later stage, but the implant type is irrelevant as P1 is fully salicided at a later stage in the preferred embodiment.

In another embodiment, the $V_T$ implantation is done with a masked P– implant followed by masked N– implant. In yet another embodiment, the $V_T$ implantation step is performed after the P1 is etched. Then patterned and implanted P1 is subjected to dopant activation. In one embodiment MILC is avoided by using an RTA cycle instead to activate & crystallize the poly after it is doped and patterned to near single crystal form. The Ni in Via-2 center is salicided during the RTA or MILC cycle seeding a phase transition in poly-crystalline silicon to single phase. P1 surrounding Via-2 center in contact with Ni is salicided, while the remaining P1 where transistors are built is crystallized to near single crystal form.

Then as shown in FIG. 7.3 the TFT gate dielectric layer is deposited. The dielectric is deposited by PECVD techniques to a desired thickness in the 30-300 A range, desirably 70 A-100 A thick. In other embodiments, this gate may be grown thermally by using a low temperature RTA. This gate material could be an oxide, nitride, oxynitride, ONO structure, or any other dielectric material combination used as gate dielectrics in the semiconductor industry. The dielectric thickness is determined by the voltage level of the process. A buried contact mask (BC) is used to open selected P1 to P2 contact regions and the dielectric is removed on top of P1 layer in the contacts. BC could be used on P1 pedestals to form P1/P2 stacks over via. This BC is used to connect the gate electrode of the pass-gate to the inverter output, and to form the cross-couple connections in the SRAM cell. In another embodiment, BC is avoided by using the upper metal to make the necessary TFT layer connections.

Then second poly P2 layer, 300 A to 2000 A thick, preferably 500 A is deposited. P2 is deposited in amorphous poly-silicon form by LPCVD as shown in FIG. 7.3. P2 is blanket implanted with P+ dopant as shown by (a) in FIG. 73. This P+ is later used for P+ doped P2 interconnect and Gated-NFET gate regions. The implant energy ensures no dopant penetration into the 70 A gate oxide underneath the P2 layer. An N+ mask as shown by (b) in FIG. 7.3, is used to select Gated-PFET device gate regions and N+ interconnect, and implanted with N+ dopant. This N+ dose is higher than blanket P+ dopant to counter-dope regions that receive both implant types. This P+/N+ implants can be done with P+ mask followed by N+ mask quite easily. The $V_T$ implanted P1 source, drain and channel regions are completely covered by P2 layer and receives no P+ or N+ implant.

P2 layer is defined into Gated-NFET & Gated-PFET gate regions, via-2 stacked pedestals if needed and local P2 interconnect lines and then etched as shown in FIG. 7.4. The gate regions are orthogonal to P1 body regions. Source & drain P1 regions are self aligned to P2 gate edges with P2 gate covering P1 body regions. The P2 layer etching is continued until the dielectric oxide is exposed over P1 areas uncovered by P2 (source, drain, P1 resistors, P1 pedestals). All devices are blanket implanted with LDN N– dopant designed for Gated-NFET LDD regions as shown by (a) in FIG. 7.4. Then Gated-PFET devices are mask selected and implanted with LDP P– dopant as shown by (b) in FIG. 7.4. The implant energy for both ensures full dopant penetration through the residual oxide into the S/D tip regions adjacent to P2 layers & P1 interconnect lines. Both LDN and LDP implant doses are small enough not to affect the N+ and P+ gate doping levels on P2 regions.

A spacer oxide is deposited over the LDD implanted P2 using LTO or PECVD techniques. The oxide is etched to form spacers as shown in FIG. 7.5. The spacer etch leaves a residual oxide over P1 in a first embodiment, and completely removes oxide over exposed P1 in a preferred embodiment. Nickel is deposited over P2 and salicided to form a low resistive refractory metal on exposed poly by RTA. Both exposed P1 and P2 regions are salicided. Un-reacted Ni is etched off. The Ni thickness is chosen to fully consume all of P1 in the exposed P1 regions. As P2 is thicker than P1, P2 is only partially salicided. After salicidation, P1 is left only in the LDD regions underneath spacers and body regions underneath P2 gates. This 100 A-500 A thick Ni-Salicide connects the opposite doped poly-2 regions together providing low resistive P2 wires for interconnect. It also provides fully salicided P1 wires for interconnect. Thus the TFT module comprises two layers of salicided poly interconnect wires. In one embodiment, the residual gate dielectric left after the spacer prevents P1 layer salicidation. This approach can be used for MOSFET device formation as disclosed in incorporated by reference application Ser. No. 10/413,810. In a second embodiment, as the residual oxide is removed over exposed P1 after spacer etch, P1 is partially or fully salicided. The thickness of Ni deposition may be used to control full or partial salicidation of P1 regions. Fully salicided S/D regions up to spacer edge facilitate high drive current due to lower source and drain resistances.

An LTO film is deposited over P2 layer, and polished flat with CMP. This forms IMD-3 of the processing steps. A third via mask Via-3 is used to open holes into the TFT P2 and P1 regions as shown in FIG. 7.6. Ti/TiN glue layer and W is used to fill the plugs and CMP polished. M3 is deposited, patterned and etched. As shown in FIG. 7.6, the TFT module connects to substrate circuits through Via-2 connections, and to upper metal layers through Via-3 connections.

An on pass-gate in the TFT module connects either end of the transistor. Such a connection is mapped to a metal mask option as shown in FIG. 7.7 by connecting the two via nodes with a metal link. An off pass-gate makes no connection, and that is mapped to a custom metal mask by a disconnected metal link. Thus a single custom metal layer can duplicate the programmable connection pattern in FIG. 7.6 identically. This custom mask can be generated by a software program using the bit-pattern in the SRAM bits. Each memory element having a logic output "one" defines a connection, while each memory element having a "zero" logic output defines a disconnect state. The memory bit map can be used to generate the hard-wire custom metal mask.

During the customization, the base die and the data in those remaining mask layers do not change making the logistics associated with chip manufacture simple. Removal of the SRAM module provides a lower cost standard logic process for the final ASIC construction with the added benefit of a smaller die size. When the resistance of the on pass-gate and the replaced metal link match, the design timing is unaffected by this migration as lateral metal routing and substrate level transistors are untouched. Gated-FET transistor on resistance is discussed in incorporated by reference application Ser. No. 10/413,808, and shown to be very sensitive to Vcc value. Thus a resistance match can be achieved as follows. In the TFT embodiment, pass-gate transistor channel width, P1 doping and P1 transistor channel length govern the on transistor resistance $R_{ON}$ as given by:

$$R_{ON} = \rho_{S0} * L_S / [W_S * ((1+\gamma)T_S)] \text{ Ohms} \quad \text{(EQ 1)}$$

Where $W_S$ is the device channel width, $L_S$ is the device channel length, $T_S$ is the P1 film thickness and $\rho_{S0}$ is the P1 resistivity at selected doping level for thin film channel region. Parameter $\gamma$ absorbs the channel modulation effect due to Vcc value above flat-band voltage ($V_{FB}$). The $\gamma$ value depends on the depth of the accumulation region into thin film channel and can be in the range 1.0 to 5.0 based on (Vcc-$V_{FB}$) value. As described in Eq-1, $R_{ON}$ is significantly reduced by the SRAM output voltage that drives the on transistor gate. Higher the drive voltage, lower the resistance. The SRAM Vcc can be provided as a variable voltage to the user. By raising the voltage level, $\gamma$ is increased, $R_{ON}$ is lowered, and the programmable wire structure will show improved timing characteristics. A metal thickness, resistivity, width and length to replace the TFT pass-gate is chosen such that the final resistance closely match pass-gate on resistance at some elevated Vcc level. Metal line resistance $R_M$ can be expressed as:

$$R_M = \rho_M * L_M / [W_M * T_M] \text{ Ohms} \quad \text{(EQ 2)}$$

Where $W_M$ is the metal width, $L_M$ is the metal length, $T_M$ is the metal thickness and $\rho_M$ is the metal resistivity. Thus the design migration can allow two possibilities to the user: (i) timing kept identical at normal operating Vcc level between the two options, (ii) timing is improved but identical with an elevated Vcc level in the programmable option. This provides a very useful timing improvement option to the user, the improvement verifiable in the programmable TFT option prior to conversion. As the programmable structured ASIC is not meant for manufacturing under the second scenario, time dependant die electric breakdown (TDDB) driven reliability is not a concern. Ability to generate a custom mask by a Software algorithm guarantees an original programmable wire structure design to port to a customized hard-wire solution for the user. A full disclosure of the ASIC migration from an original FPGA is provided in the incorporated by reference applications discussed above.

Figure 8A:
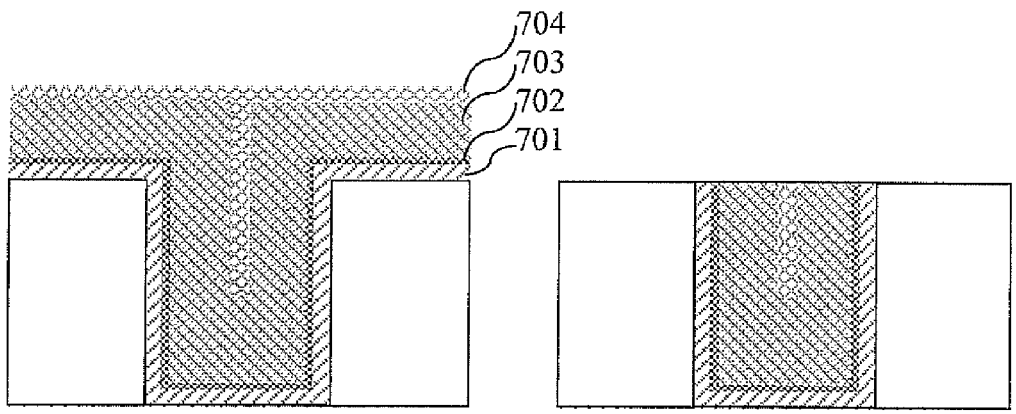
FIG. 8 shows a pass-gate programmable switch mapped to hard-wires.
Figure 8B:
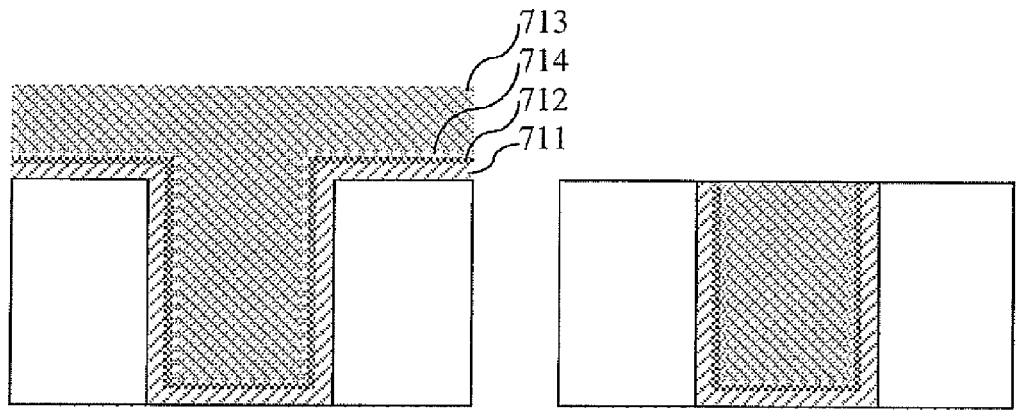
Figure 8C:
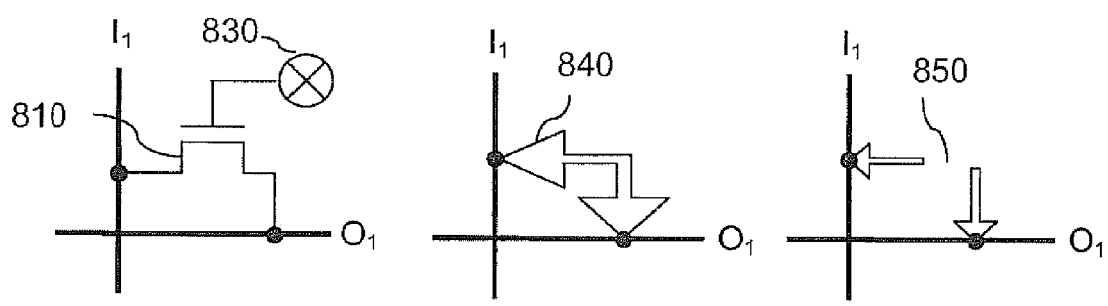
Figure 9A:
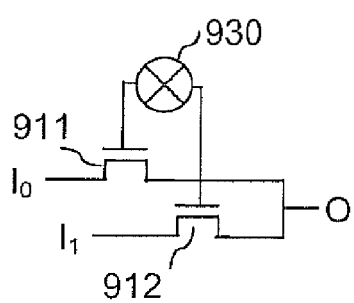
FIG. 9A shows a programmable 2:1 MUX construction with one SRAM control bit.
Figure 9B:
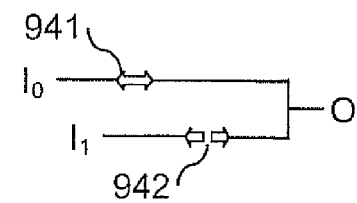
FIG. 9B shows a first mapping of programmable 2:1 MUX to hard-wires.
Figure 9C:
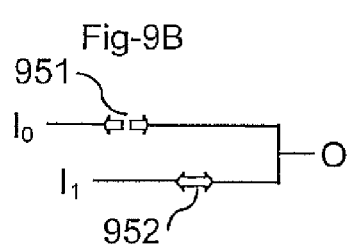
FIG. 9C shows a second mapping of programmable 2:1 MUX to hard-wires.

The ASIC migration path for the point to point wire connection is shown in FIG. 8. The TFT option has pass-gate 810 controlled by an SRAM memory cell 830 as shown in FIG. 8A. As shown in FIG. 8B, an SRAM output at logic one is mapped to metal connection 840 for the point to point connection. When the SRAM bit output is at a logic zero, the point to point connection is left open as shown by 850 in FIG. 8C. A 2:1 wire MUX connection is shown in FIG. 9. In FIG. 9A, a single memory bit 930 selects which input is connected to output. Memory bit 930 output polarity selects the programmable path for the connection. This 2:1 MUX is mapped into one of two possible hard-wire masks as shown in FIG. 9B and FIG. 9C respectively. In FIG. 9B, $I_0$ is connected to O by metal link 941, and in FIG. 9C, $I_1$ is connected to O by metal link 952.

In FIG. 6, the third module layer is formed substantially above the first and second module layers, wherein interconnect and routing signals are formed to connect the circuit blocks within the first and second module layers. Alternatively, the third module layer can be formed substantially below the first and second module layer with interconnect and routing signals formed to connect the circuit blocks within the first and second module layers. Alternatively, the third and fourth module layers positioned above and below the second module layer respectively, wherein the third and fourth module layers provide interconnect and routing signals to connect the circuit blocks within the first and second module layers.

As the discussions demonstrate, memory controlled pass-gate logic elements provide a powerful tool to make switches. The ensuing high cost of memory can be drastically reduced by the 3-dimensional integration of configuration elements and wire pass-gates and by the replaceable modularity concept for said circuits. These advances allow designing a routing block to overcome the deficiencies in current FPGA designs. In one aspect, a cheaper memory element allows use of more memory for programmable wire connections. This allows the flexibility of constructing logic blocks on substrate silicon, and constructing routing blocks vertically above the logic blocks. The substrate level circuit programmability and the routing level circuit programmability are kept separate. This enhances the ability to build large logic blocks (i.e. course-grain advantage) while maintaining smaller element logic fitting (i.e. fine-grain advantage). Furthermore larger grains need less connectivity: neighboring cells and far-away cells. That further simplifies the interconnect structure. These interconnect points are elevated to a programmable TFT layer, and a mapping hard-wire layer to provide the customer both design flexibility and manufacturing cost advantage. A programmable wire structure utilizing the methods shown so far is discussed next.

Figure 10A:
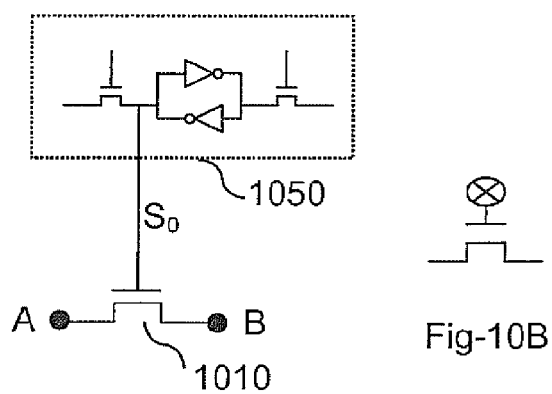
FIG. 10A shows a programmable pass-gate with TFT SRAM memory element.

A point to point switch in accordance with this teaching is shown in FIG. 10A. In that, point A is connected to point B with a TFT pass-gate 1010. This device has high performance single crystal Si body from the germanium and MILC techniques employed in the manufacturing process. These TFT transistors are also used to build the configuration circuits, including memory elements, as shown in dotted box 1050. Pass-gate 1010 and configuration circuit 1050 is located in between two metal layers. The configuration circuit 1050 includes a thin film transistor memory element. This memory element is either a volatile or a non volatile memory element. The volatile memory is comprised of DRAM, SRAM or optical memory device. The non-volatile memory is comprised of EPROM, EEPROM, ferro-electric, electro-chemical, magnetic, fuse-link or anti-fuse element. FIG. 10A illustrates an SRAM embodiment for configuration circuit. The configuration circuit 1050 outputs a control signal $S_0$ to control pass-gate 1010. This $S_0$ voltage level may be at Vcc or ground based on memory bit polarity. The $S_0$ voltage may also be at an elevated Vcc when the SRAM is run at that higher Vcc level. The configuration circuit 1050 includes circuitry to write data into the memory element. Thus output $S_0$ can be programmed to logic 1 or logic 0 by changing memory bit polarity. The configuration circuit includes a plurality of memory bits to program a plurality of pass-gates. The memory elements in the configuration circuit are arranged in an array fashion to allow either individual access or row by row access or column by column access to memory elements. The configuration memory circuit includes generic SRAM memory based capability to store user specified data. Configuration circuit includes metal wires to provide some limited configuration signals, power and ground to memory elements. These wires may be salicided polysilicon wires. In one embodiment the SRAM memory is comprised of TFT devices to form the circuit shown in FIG. 3A, further comprising TFT transistors 301 and 302 to access the latch, and TFT inverters 303 and 304 to form a bistable latch. These transistors are MOSFET or Gated-FET devices. In preferred embodiment, signal line $S_0$ is directly coupled to pass-gate 1010 in FIG. 10A by a buried contact between P1 and P2.

Figure 10B:
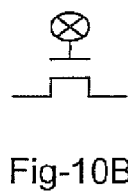
FIG. 10B shows the symbol for a TFT memory based programmable pass-gate.

The point to point switch with TFT configuration circuits in FIG. 10A is denoted by the symbol shown in FIG. 10B. In FIG. 10B, the circle with a cross represents the configuration circuit containing a TFT SRAM memory (or any other 3-dimensional memory) element. All transistors in FIG. 10B represent TFT devices fabricated on a re-crystallized poly layer.

Figure 10C:
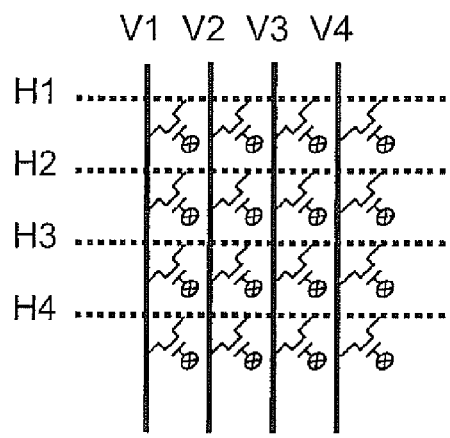
FIG. 10C shows a 4×4 array of TFT memory based programmable pass-gates.

The pass-gate could be constructed on separate TFT layers, with configuration circuits on more TFT layers integrated above that. A 4×4 programmable wire cross-point switch matrix utilizing the point to pint switch in FIG. 10A is shown in FIG. 10C. In FIG. 10C, every intersection point between the V-lines (V1 to V4) and H-lines (H1 to H4) is populated with a point to point switch. This could be fully populated as shown, or partially populated depending on the need. The TFT circuit for FIG. 10C has 16 pass-gates and 16 6 T-memory elements with configuration access transistors to change memory data. A programmable means to configure the cross point matrix include setting memory data to achieve a user specified connecting pattern. Compared to standard planar SRAM technology, the new cross-point wire switch has all of 112 TFT transistors vertically above the substrate module, reducing the die area required drastically. Furthermore, planar substrate SRAM contain CMOS structures and is impacted by N-well related spacing rules for latch-up prevention. TFT has no such latch-up restrictions providing extra area savings for the TFT scheme. The new point to point switch allows over 80% reduction in silicon utilization for such wire connections.

Figure 10D:
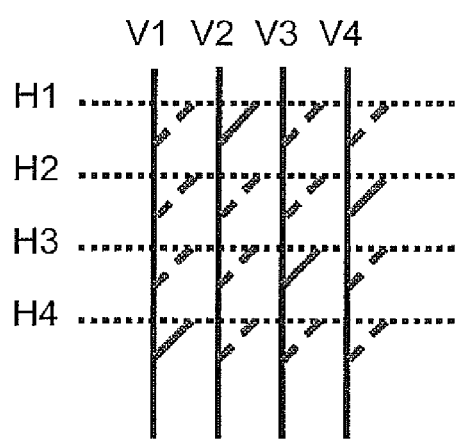
FIG. 10D shows a first mapping of 4×4 programmable array to a hard-wire array.
Figure 10E:
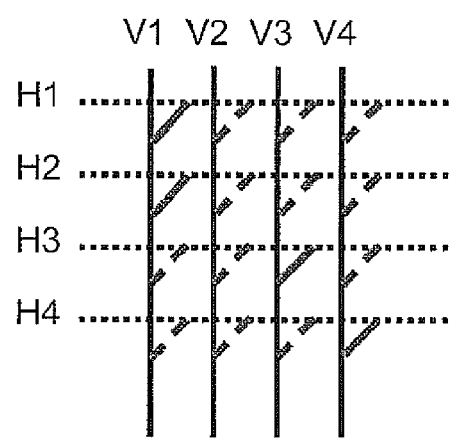
FIG. 10E shows a second mapping of 4×4 programmable array to a hard-wire array.

The programmable wire structure in FIG. 10C has a plurality of programmable interconnect patterns. The exact connection is programmed by the user. For each programmed pattern, there is a unique hard-wire pattern that duplicates the connections. Two such hard-wire connection patterns are shown in FIG. 10D and FIG. 10E respectively. In FIG. 10D, one of H wires is connected to one of V wires. Specifically, H1-V2, H2-V4, H3-V3 and H4-V1 are connected. This outcome is achieved in the programmable option by setting those cross-point bits to output logic one, while the remaining bits are set to output logic zero. In FIG. 10E, V1 is connected to H1 and H2, V3-H3 and V4-H4. The bit maps for memory data differ between the two connecting patterns in FIG. 10D and FIG. 10E. Each bit map generates the corresponding unique hard-wire pattern.

Figure 11A:
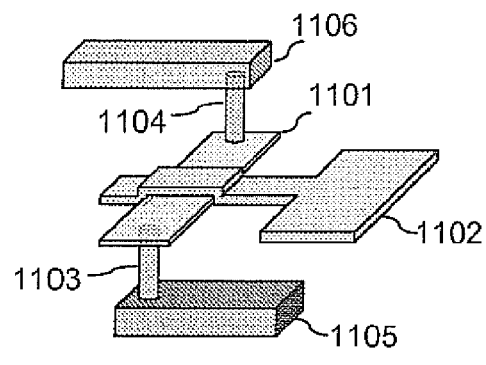
FIG. 11A shows a programmable TFT switch connecting a lower metal to upper metal.
Figure 11B:
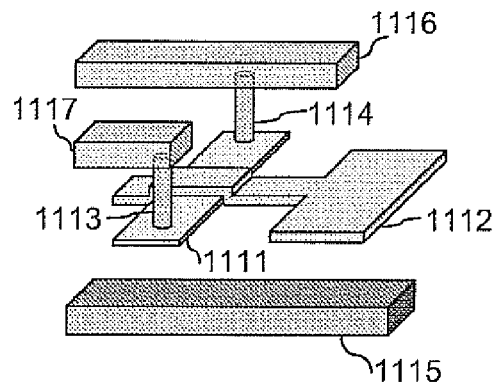
FIG. 11B shows a programmable TFT switch connecting an upper metal to upper metal.
Figure 11C:
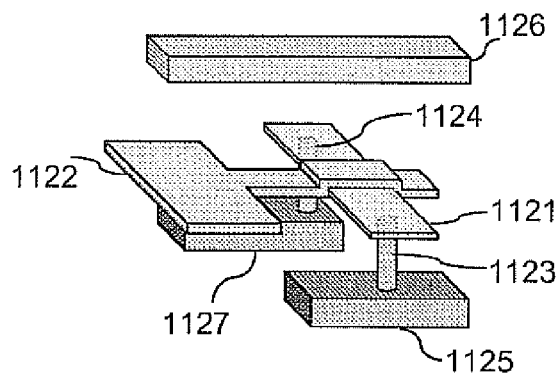
FIG. 11C shows a programmable TFT switch connecting a lower metal to lower metal.

The programmable switches allow three types of metal connections: lower metal lines to each other, upper metal lines to each other, and lower metal lines to upper metal lines. These are shown in FIG. 11. In FIG. 11A, a pass-gate switch connecting a lower metal line 1105 to upper metal line 1106 is shown. The pass-gate comprises a crystallized P1 body region 1101 and a salicided P2 gate electrode 1102. The gate region of the transistor is the P2 1102 overlap region crossing P1 1101. A Via-2 1103 thru-hole connects one end of pass-gate active region to the lower metal 1105. A Via-3 1104 connects the other end of pass-gate active region to upper metal 1106. Ni is contained at the center of Via-2. A 6 T or 5 T SRAM cell, also fabricated on the same layers as 1101 and 1102 (not shown in FIG. 11A), drives the gate 1102. When the SRAM cell outputs a logic one, the pass-gate is on and metal line 1105 connects to metal line 1106. The resistance between the two metal nodes is the on resistance of channel in P1 1101 body region. FIG. 11B illustrates a programmable pass-gate between two upper metal wires 1116 and 1117. Both via 1113 and 1114 are Via-3 thru-holes connecting TFT layer to upper metal. Those via have no seed Ni and use regular via processing. FIG. 11C illustrates a programmable pass-gate between two lower metal wires 1125 and 1127. Both via 1123 and 1124 are Via-2 thru-holes connecting TFT layer to lower metal. Those via have seed Ni during via processing to facilitate crystal growth in P1 layer.

Figure 1C:
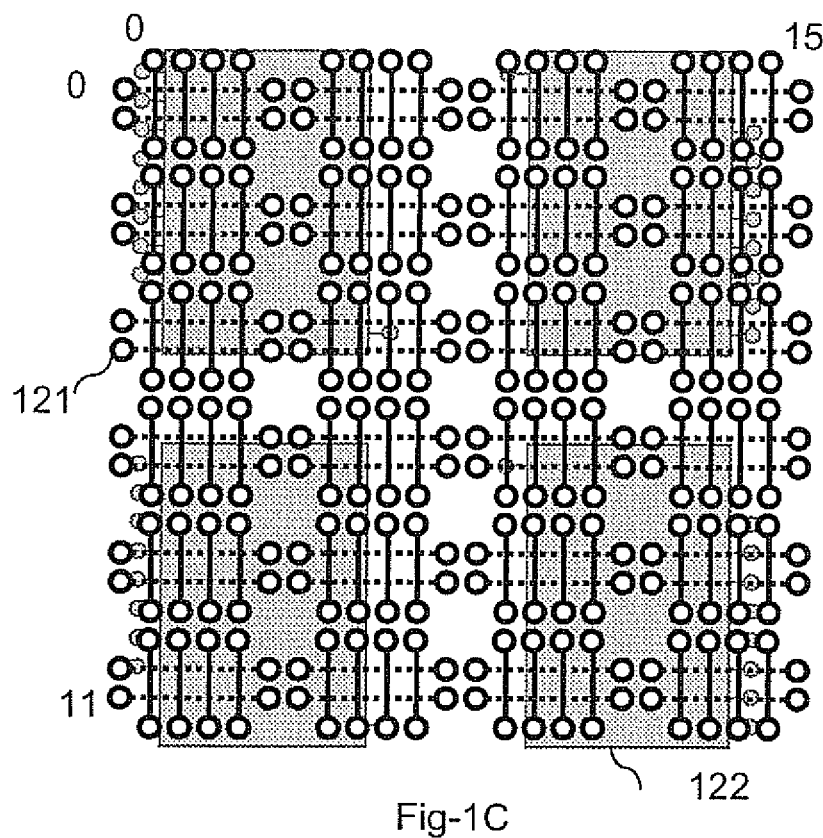
FIG. 1C shows an exemplary customizable hard-wire structure utilizing a structured cell.
Figure 2A:
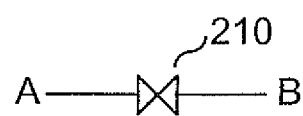
FIG. 2A shows an exemplary fuse link point to point connection.
Figure 2B:
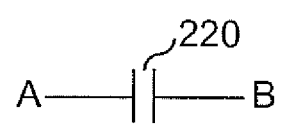
FIG. 2B shows an exemplary anti-fuse point to point connection.
Figure 2C:
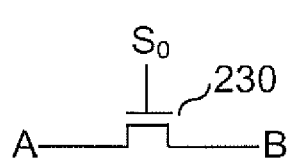
FIG. 2C shows an exemplary pass-gate point to point connection.
Figure 2D:
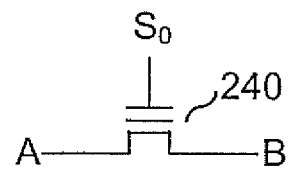
FIG. 2D shows an exemplary floating-pass-gate point to point connection.
Figure 12:
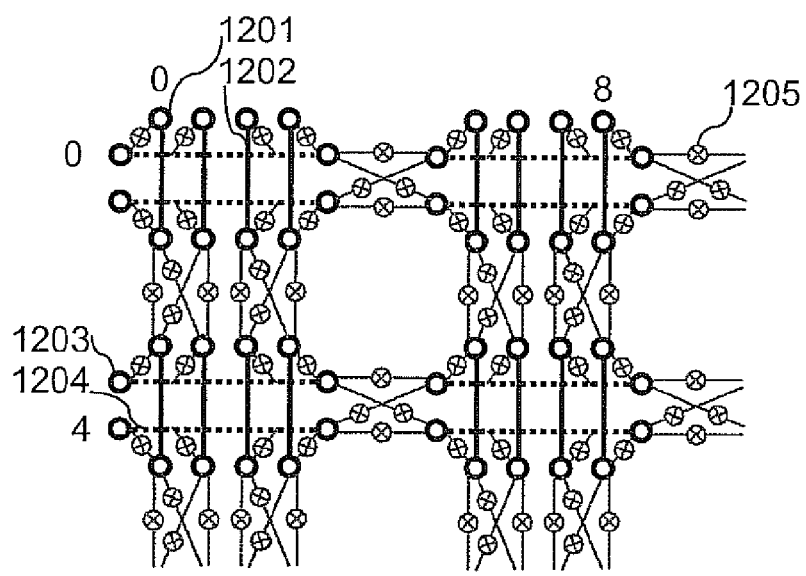
FIG. 12 shows one embodiment of a programmable wire structure to replace the custom hard-wire structure shown in FIG. 1C.

In one embodiment of this novel programmable wire switch methodology, the mask programmable metal pattern shown in FIG. 1C is constructed as shown in FIG. 12. Only 8 vertical lower level metal wires 1202 and 4 horizontal upper level metal wires 1204 are shown to demonstrate the methodology. In FIG. 12 there is a plurality of horizontal wires 1202 and a plurality of vertical wires 1204. The lower level wires connect to a bottom plurality of via connections 1203 that connect to the middle TFT layers. These via connections are similar to 1123 and 1124 shown in FIG. 11C. The upper metal wires 1204 connect to a plurality of upper via connections 1201 that connect to TFT layers. These via connections are similar to 1113 and 1114 shown in FIG. 11B. All pass-gates are coupled to these via points, even though for illustrative purposes FIG. 12 shows some pass-gate connections terminating on wires. An array of SRAM controlled programmable pass-gates 1205 makes a cross-point matrix to connect the metal grid in FIG. 12. These switches 1205 make all 3-types of connections shown in FIG. 11 and are sandwiched between the two metal layers. Lower metal wires 1202 belong to the first module layer 650 in FIG. 6. Upper metal wires 1204 belong to the third module layer 654 in FIG. 6. These wires are pre-fabricated and need no replacements between the programmable and hard-wire options. Only the TFT P1 and P2 transistors need to be replaced in the hard-wire mask: replacing the on pass-gate with an equivalent resistance metal shunt. Many other pass-gate connections can be provided to complete very complex programmable connections between the wires. The best wire structure and the programmable options are optimized in the product definition phase to provide over 99% routability to the end user.

New programmable wire structures are described to provide a user programmable option to Structured Array and Gate Array type ASIC devices. Such an option improves the time to solution and reduces the initial verification cost of a new design. The programmable switches contain pass-gates and configuration circuits constructed in thin-film layers. The TFT layers are sandwiched between two metal layers, facilitating connections between wires in said two metal layers. On conduction of the switch is improved by process conditions that facilitate phase changes in poly-silicon. It is further improved by allowing the user to increase Vcc in the TFT module. The processing of TFT module includes a seed metal in a lower via structure that is exposed to first poly thin film. TFT pass-gates and 6 T or 5 T SRAM cells allow very powerful MUX construction to connect metal wires. Data wires driven by buffers in the substrate are routed using a matrix of point to point TFT switches that are customized by the user. Once the programming pattern is finalized, and the device is tested and verified for performance, the TFT cells can be eliminated by hard-wire connections. Such conversions allow the user a lower cost and more reliable end product. These products offer an enormous advantage in lowering NRE costs and improving TTS in the ASIC design methodology in the industry.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A device comprising:
   a layer comprising a pass-gate and a configuration circuit coupled to said pass-gate, wherein said pass-gate is configured to receive an output of said configuration circuit;
   a first metal line; and
   a second metal line;

said pass-gate configured to electrically connect said first and second metal lines and configured to electrically disconnect said first and second metal lines, according to a state of said output.

2. The device of claim 1, wherein said pass-gate and said configuration circuit comprise thin film transistors (TFTs).

3. The device of claim 1, wherein said first metal line and said second metal line are both located on one side of said layer.

4. The device of claim 1, wherein said first metal line and said second metal line are located on opposite sides of said layer.

5. The device of claim 1, wherein said configuration circuit comprises a memory element, wherein said output comprises a control signal that has a first voltage level if said memory element has a first polarity and a second voltage level if said memory element has a second polarity.

6. The device of claim 1, wherein said configuration circuit comprises a type of memory circuit selected from the group consisting of fuse, anti-fuse, EPROM, EEPROM, flash, ferro-electric, magnetic, SRAM, DRAM, metal optional, optical, laser fuse, photo-electric, electro-chemical, electrolytic, carbon nanotube, electro-mechanical, electro-magnetic, and resistance modulating.

7. The device of claim 1, further comprising:
a first through-hole via connecting said pass-gate at one end to said first metal line; and
a second through-hole via connecting said pass-gate at another end to said second metal line.

8. A structure comprising:
a first plurality of wires including a first wire;
a second plurality of wires including a second wire; and
a plurality of pass-gates coupled to said first plurality of wires and to said second plurality of wires, said plurality of pass-gates including a pass-gate coupled at one end to said first wire and at another end to said second wire, said pass-gate also coupled to a configuration circuit, wherein said pass-gate and said configuration circuit are in a same layer of said structure; wherein said first wire is configured to be electrically connected to and electrically disconnected from said second wire responsive to turning on and turning off said pass-gate according to a state of an output of said configuration circuit.

9. The structure of claim 8, wherein said configuration circuit comprises a memory element, wherein said output comprises a control signal that has a first voltage level if said memory element has a first polarity and a second voltage level if said memory element has a second polarity.

10. The structure of claim 8, wherein said configuration circuit comprises a type of memory circuit selected from the group consisting of: fuse, anti-fuse, EPROM, EEPROM, flash, ferro-electric, magnetic, SRAM, DRAM, metal optional, optical, laser fuse, photo-electric, electro-chemical, electrolytic, carbon nanotube, electro-mechanical, electro-magnetic, and resistance modulating.

11. The structure of claim 8, wherein said first plurality of wires and said second plurality of wires are configured to be electrically interconnected in a pattern responsive to selectively turning on a first subset of said plurality of pass-gates and selectively turning off a second subset of said plurality of pass-gates.

12. The structure of claim 11, wherein said configuration circuit comprises a plurality of memory elements coupled to said plurality of pass-gates, wherein said first subset of pass-gates is configured to be turned on and said second subset of pass-gates is configured to be turned off according to bit values stored in said memory elements.

13. The structure of claim 12, wherein said bit values are programmable and wherein said pattern is changeable in response to a change in said bit values.

14. A structure comprising:
a first layer comprising a first plurality of wires;
a second layer comprising a second plurality of wires;
a third layer between said first layer and said second layer and comprising a plurality of pass-gates and a configuration circuit; wherein said pass-gates are configured to be selectively turned on to enable one or more types of electrical connections, said types of electrical connections comprising: an electrical connection between two wires in said first layer; an electrical connection between two wires in said second layer; and an electrical connection between a wire in said first layer and a wire in said second layer.

15. The structure of claim 14, wherein said pass-gates and said configuration circuit comprise thin film transistors (TFTs).

16. The structure of claim 14, wherein said configuration circuit comprises a type of memory circuit selected from the group consisting of: fuse, anti-fuse, EPROM, EEPROM, flash, ferro-electric, magnetic, SRAM, DRAM, metal optional, optical, laser fuse, photo-electric, electro-chemical, electrolytic, carbon nanotube, electro-mechanical, electro-magnetic, and resistance modulating.

17. The structure of claim 14, further comprising:
a first plurality of through-hole vias coupled to pass-gates in said third layer and to wires in said first layer; and
a second plurality of through-hole vias coupled to pass-gates in said third layer and to wires in said second layer.

18. The structure of claim 14, wherein said first plurality of wires and said second plurality of wires are configured to be electrically interconnected in a pattern responsive to selectively turning on a first subset of said plurality of pass-gates and selectively turning off a second subset of said plurality of pass-gates.

19. The structure of claim 18, wherein said configuration circuit comprises a plurality of memory elements coupled to said plurality of pass-gates, wherein said first subset of pass-gates is configured to be turned on and said second subset of pass-gates is configured to be turned off in response to bit values stored in said memory elements.

20. The structure of claim 19, wherein said bit values are programmable and wherein said pattern is changeable in response to a change in said bit values.

* * * * *